United States Patent [19]

Yamanouchi et al.

[11] Patent Number: 5,438,306

[45] Date of Patent: Aug. 1, 1995

[54] SURFACE ACOUSTIC WAVE FILTER DEVICE WITH SYMMETRICAL ELECTRODE ARRANGEMENT

[75] Inventors: Kazuhiko Yamanouchi, Sendai; Mitsuhiro Tanaka, Chita; Yasufumi Horio, Nagoya, all of Japan

[73] Assignees: Kazuhiko Yamanouchi; NGK Insulators, Ltd., Japan

[21] Appl. No.: 85,121

[22] Filed: Jul. 1, 1993

[30] Foreign Application Priority Data

Jul. 2, 1992 [JP] Japan .................. 4-215370
Dec. 22, 1992 [JP] Japan .................. 4-361917
Mar. 5, 1993 [JP] Japan .................. 5-045362

[51] Int. Cl.$^6$ .......................................... H03H 9/64
[52] U.S. Cl. .................................. 333/195; 333/194; 310/313 B
[58] Field of Search .............................. 333/193–196; 310/313 R, 313 B, 313 C, 313 D

[56] References Cited

U.S. PATENT DOCUMENTS

| 3,727,155 | 4/1973 | DeVries | 333/194 |
| 3,748,603 | 7/1973 | Wojak | 333/194 |
| 3,987,376 | 10/1976 | Kerbel . | |

FOREIGN PATENT DOCUMENTS

| 0530041 | 3/1993 | European Pat. Off. | 333/195 |
| 0113512 | 6/1905 | Japan | 333/193 |
| 0010724 | 2/1981 | Japan | 333/194 |
| 0210713 | 9/1987 | Japan | 333/195 |
| 0204212 | 9/1991 | Japan | 333/193 |
| 4138710 | 5/1992 | Japan | 333/195 |

OTHER PUBLICATIONS

Japanese Journal of Applied Physics, Supplements, vol. 30 SU, No. 1, 1991, Tokyo JA, pp. 173–175, XP000305676 Yamanouchi et al. "Wide Bandwidth Low Loss Filters Using Piezoelectric Leaky Saw Unidirectional Transucers With Floating Electrodes".

IEEE Transactions on Microwave Theory and Techniques, vol. 33, No. 6, Jun. 1985, New York US pp. 510–518, Mitsutaka Hikita et al. "800-MHZ High-Performance Saw Filter Using new Resonant Configuration".

Siemens Forschungs-und Entwicklungsberichte, vol. 6, No. 3, 1977, Berling De pp.132–136, A. Gunther et al. "Speeding Up the Anaysis of Surface Acoustic Wve Devices".

*Primary Examiner*—Robert J. Pascal
*Assistant Examiner*—Darius Gambino
*Attorney, Agent, or Firm*—Parkhurst, Wendel & Rossi

[57] ABSTRACT

A surface acoustic wave filter device includes a substrate which includes quartz or the like piezoelectric material having a small temperature coefficient. The substrate has a surface which is formed with interdigital-type unidirectional transducers on input and output sides, each having a positive electrode and a negative electrode. The positive electrodes and the negative electrodes of each of the input side and output side transducers have electrode fingers which are arranged so as to transduce a harmonic wave of a selected order which is higher relative to a fundamental surface acoustic wave.

10 Claims, 25 Drawing Sheets

FIG_17

FIG_19

FIG_22

FIG_24
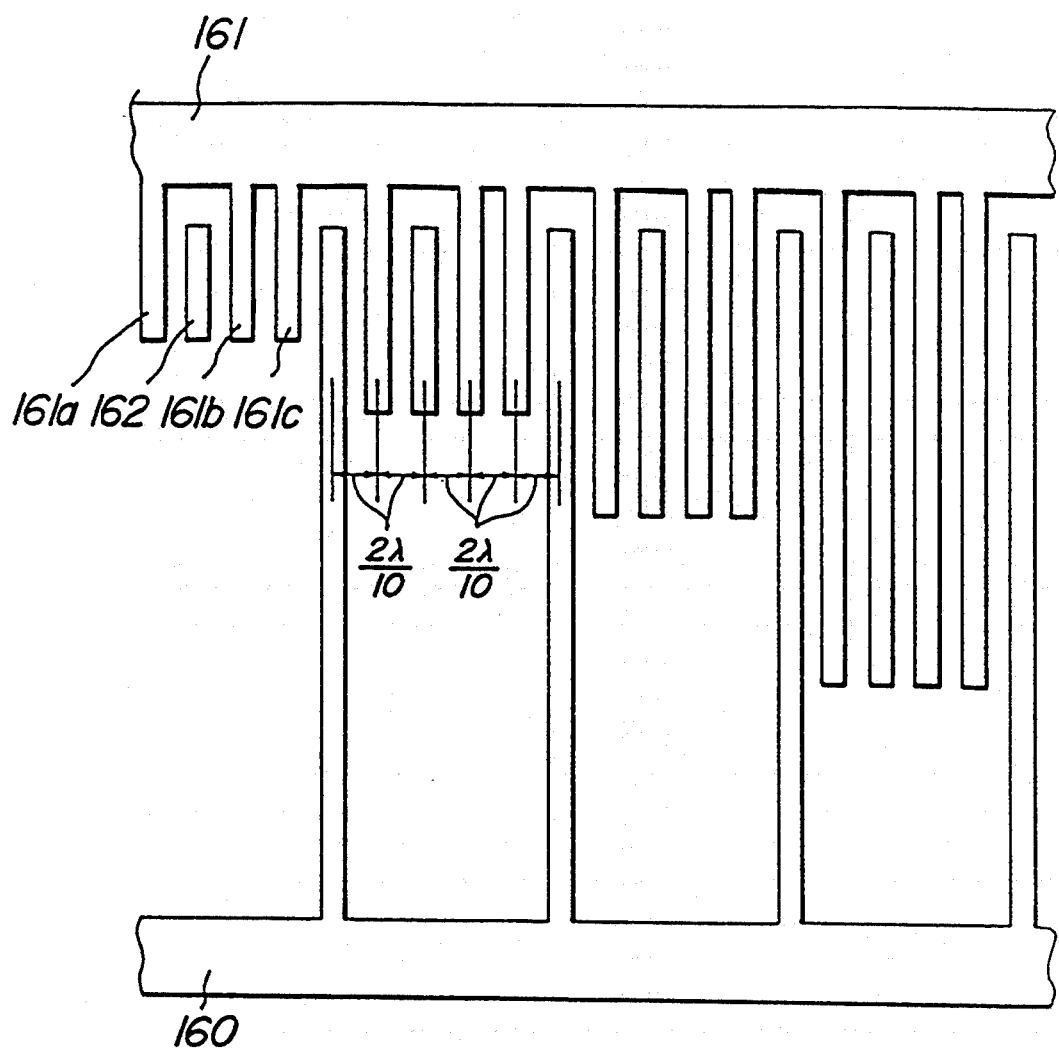

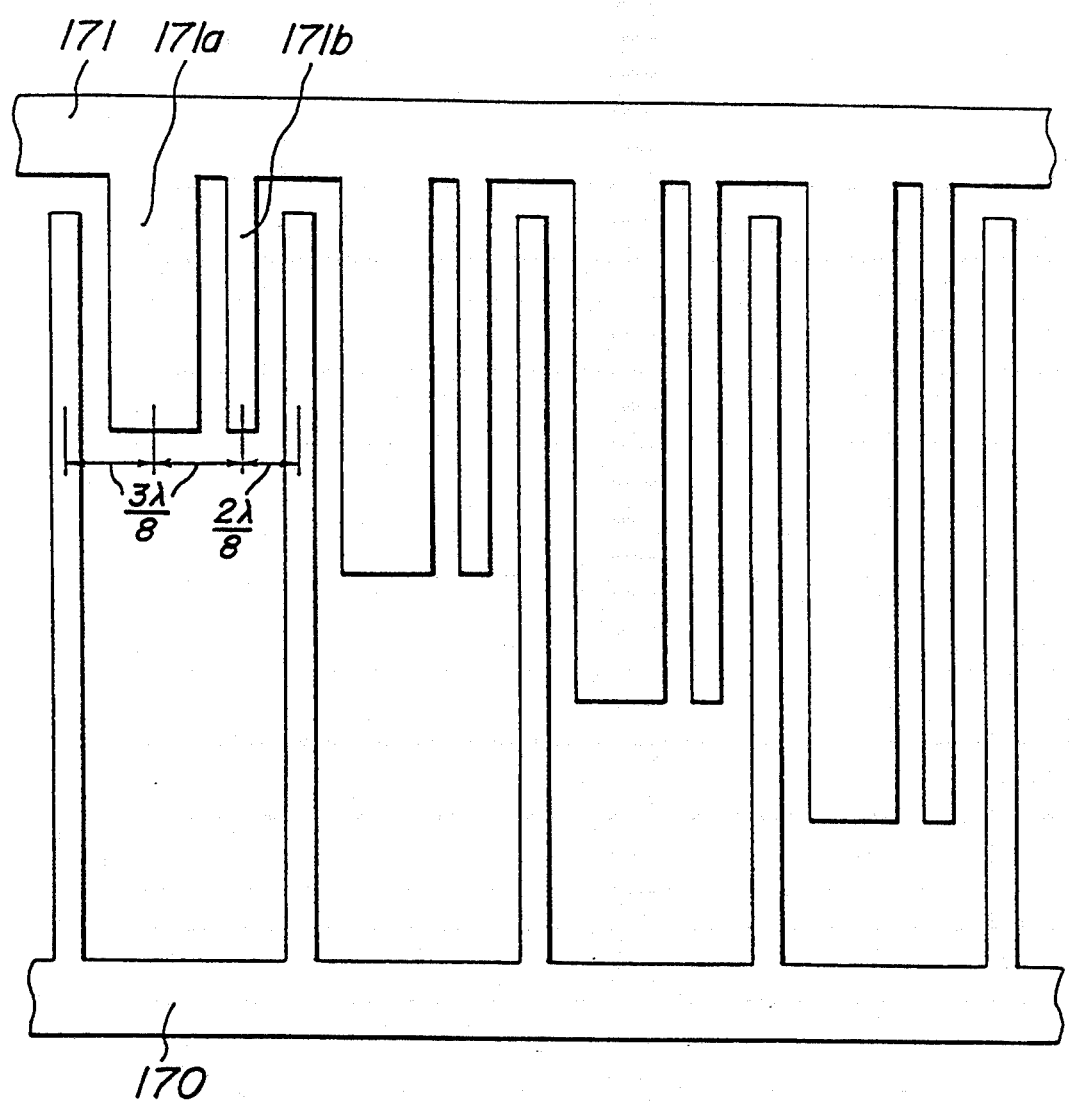
FIG_25

SURFACE ACOUSTIC WAVE FILTER DEVICE WITH SYMMETRICAL ELECTRODE ARRANGEMENT

BACKGROUND OF THE INVENTION

1. Field of the Invention

The present invention relates to a surface acoustic wave (SAW) filter device, and more particularly to a surface acoustic wave filter device which includes internal reflection-type unidirectional transducers.

2. Description of the Related Art

Surface acoustic wave filter devices are known and practically used which generally include a piezoelectric substrate, and interdigital-type input-side and output-side transducers (IDTs) formed on the substrate for taking out a signal at a specific frequency range.

Conventional transducers for surface acoustic wave filter devices include transversal-type transducers wherein the surface acoustic wave excited by IDT electrodes propagates equally and bidirectionally on both sides of the transducer. It is known that the transversal-type transducers and surface acoustic wave filter devices using such transversal-type transducers are accompanied by an insertion loss (a so-called "6dB loss"). Thus, in order to decrease the insertion loss of the conventional transversal-type transducers as noted above, various types of unidirectional transducers for surface acoustic wave filter devices have been proposed, wherein the surface acoustic wave propagates unidirectionally in normal propagation direction.

Unidirectional transducers according to such proposals can be roughly classified into three types, i.e., a three-phase-type transducer, a group-types transducer and an internal reflection-type transducer, which will be explained below.

The three-phase-type unidirectional transducer includes three kinds of IDT electrode fingers which are respectively applied with input signals having a phase difference of 0°, 120°, and 240°. The three-phase-type transducer is capable of maintaining the desired unidirectional property of the surface acoustic wave propagation over a wide frequency range. On the other hand, however, the three-phase-type transducer requires complicated phase shifters and also a particular arrangement wherein the electrode finger extending from one of three bus bars must be bridged over another bus bar. Therefore, the three-phase-type transducer is generally difficult to manufacture and, hence, costly.

The group-type unidirectional transducer includes meander lines as ground lines which are arranged between the IDT electrode fingers in a meandering manner. The group-type transducer is disadvantageous in that a 90° phase shifter (e.g., a coil) is required and the total length of the meander line becomes long, which results in a higher insertion loss of the filter device due to an ohmic loss.

The internal reflection-type unidirectional transducer may be provided with aluminum IDT electrode fingers which are combined with electrode fingers of a high density metal, such as gold, so that the distance between the center of excitation area and the center of reflection area of the surface acoustic wave is made $\lambda/8$ with reference to the wavelength $\lambda$ of a fundamental surface acoustic wave which has been excited. While the internal reflection-type transducer does not require a phase shifter, it had been necessary to perform not only vapor evaporation for the aluminum electrode fingers, but also an additional vapor evaporation for the gold electrode fingers to be paired with the aluminum electrode finger. Hence there had been a disadvantage that the manufacturing process becomes complicated.

One proposal has been made with respect to the internal reflection-type unidirectional transducer, which is to provide floating electrodes instead of the gold electrode fingers so that all the electrodes can be formed by a single processing step. Another proposal related to the internal reflection-type unidirectional transducer is to combine an electrode of a width $\lambda/8$ with another electrode of a width $3\lambda/8$. In these instances, there arises a tendency of a slight increase in the insertion loss due to a partial energy leakage of the surface acoustic wave in a reverse direction, i.e., a direction opposite to the propagation direction. Besides, the internal reflection-type unidirectional transducer is generally unsuitable for substrates with a small piezoelectric property, such as quartz, since the piezoelectricity of the substrate plays an important role in the reflection. However, there are instances wherein it is desirable to use quartz or the like substrate materials with a small piezoelectric property.

Apart from the above-mentioned problems, another important factor associated with surface acoustic wave filter devices is to realize an improved manufacturing yield of the unidirectional transducers. More particularly, the unidirectional transducer includes a positive electrode and a negative electrode, each comprising a plurality of electrode fingers which may be formed by a photo-lithographic process after formation of an aluminum layer on the substrate. For each of the positive and negative electrodes, the electrode fingers are spaced from each other by a center distance which corresponds to the wavelength $\lambda$ of the fundamental surface acoustic wave. The electrode fingers of the positive electrode and the electrode fingers of the negative electrode are arranged alternately with each other, with a center distance of $\lambda/2$. In this instance, for example, the width of each electrode finger is set as $\lambda/12$. Thus, as for a filter device including a ST-cut quartz substrate and having a center frequency of 240 MHz, for example, the electrode finger width of $\lambda/12$ is as fine as approximately 1.1 $\mu$m, and such a fine width often results in practical difficulties to achieve a satisfactory manufacturing yield.

SUMMARY OF THE INVENTION

It is therefore a primary object of the present invention to provide a surface acoustic wave filter device including internal reflection-type unidirectional transducers, which can be manufactured by a simple process with a satisfactory yield, which does not require external circuits such as phase shifters, and which has an excellent loss characteristic.

According to the present invention, there is provided a surface acoustic wave filter device which comprises a substrate of a piezoelectric material and having a surface; an interdigital-type input side transducer applied on the surface of substrate and including an input side positive electrode having a plurality of electrode fingers, and an input side negative electrode having a plurality of electrode fingers each arranged between successive electrode fingers of the input side positive electrode; and an interdigital-type output side transducer applied on the surface of substrate and including an output side positive electrode having a plurality of electrode fingers, and an output side negative electrode having a plurality of electrode fingers each arranged between successive electrode fingers of the output side positive electrode. The electrode fingers of positive and negative electrodes of each of said input side and output side transducers are arranged so as to transduce a harmonic wave of a selected order which is higher relative to a fundamental surface acoustic wave.

The present invention is based on a novel conception of a surface acoustic wave filter device which serves to amplify and convert a harmonic wave of the fundamental surface acoustic wave. It is then possible to realize a filter device with an increased center frequency even if the widths of the electrode finger of each electrodes is set with the condition of the fundamental surface acoustic wave. Hence, when the center frequency of the pass band is the same, the width of the electrode finger can be increased, thereby making it possible to significantly improve the manfacturing yield.

According to a particularly advantageous embodiment of the present invention, the positive electrode, negative electrode and optional floating electrode of the the input-side transducer, and the positive electrode, negative electrode and optional floating electrode of the output-side transducer are arranged so as to form a plurality of tracks extending in parallel to one another in the propagation direction of the surface acoustic wave. The lengths of the tracks may vary in serial order in the direction perpendicular to the propagation direction of the surface acoustic wave. The widths of said tracks may vary in accordance with a fixed function in the direction perpendicular to the propagation direction of the surface acoustic wave.

This embodiment is to utilize a distance weighting method to improve the side-lobe characteristic. In the distance weighting method, the portions of the interdigital-type positive and negative electrodes mutually overlapped in the propagation direction, i.e., an excitation area is constituted so as to form tracks between the input-side transducer and the output-side transducer, respectively. The lengths of the tracks vary in serial order in the direction perpendicular to the propagation direction, while the lengths (aperture lengths) of the exciting areas vary in accordance with a fixed function in the direction perpendicular to the propagation direction. Therefore, two weighting factors can be utilized properly, together with a large suppression of the side-lobe can be established by combining with an unidirectional transducer, and loss characteristics can be improved.

Furthermore, in order to improve the characteristic near the center frequency and avoid degradation in the higher frequency side due to difference in average propagation velocity of the surface acoustic wave, dummy electrodes may be provided for the input-side transducer and the output-side transducer so as to remove the effect of the frequency shift. Thus, the distance weighting method can be effectively utilized by arranging dummy electrodes so that to ensure a practical use of the second harmonic filter device having an improved side-lobe characteristic.

BRIEF DESCRIPTION OF THE DRAWINGS

FIGS. 19 to 25 are diagrams showing various modifications of a transducer which amplifies a second harmonic wave.

DETAILED DESCRIPTION OF THE PREFERRED EMBODIMENTS

The present invention will be explained in detail below with reference to the embodiments shown in the accompanying drawings.

The surface acoustic wave filter device according to the present invention includes a substrate 1 which comprises a piezoelectric and electrostrictive material or a piezoelectric thin film. Unidirectional surface acoustic wave transducers comprising interdigital-type positive and negative electrodes 2, 3 are arranged on input and output sides, on the surface of the substrate 1, to excite surface acoustic wave and to receive transmitted surface acoustic wave.

The present invention provides an internal reflection-type unidirectional surface acoustic wave transducer which operates at an operational angular frequency $N\omega$ where $\omega$ is the operational angular frequency corresponding to the wavelength $\lambda$ of the fundamental surface acoustic wave of the transducer, and N is an integer (1, 2, 3, and so on). The surface acoustic wave filter device incorporating such unidirectional transducer serves to amplify and convert a harmonic wave of the fundamental surface acoustic wave, making it possible to increase the electrode finger width and to thereby significantly improve the manufacturing yield.

Figure 1:
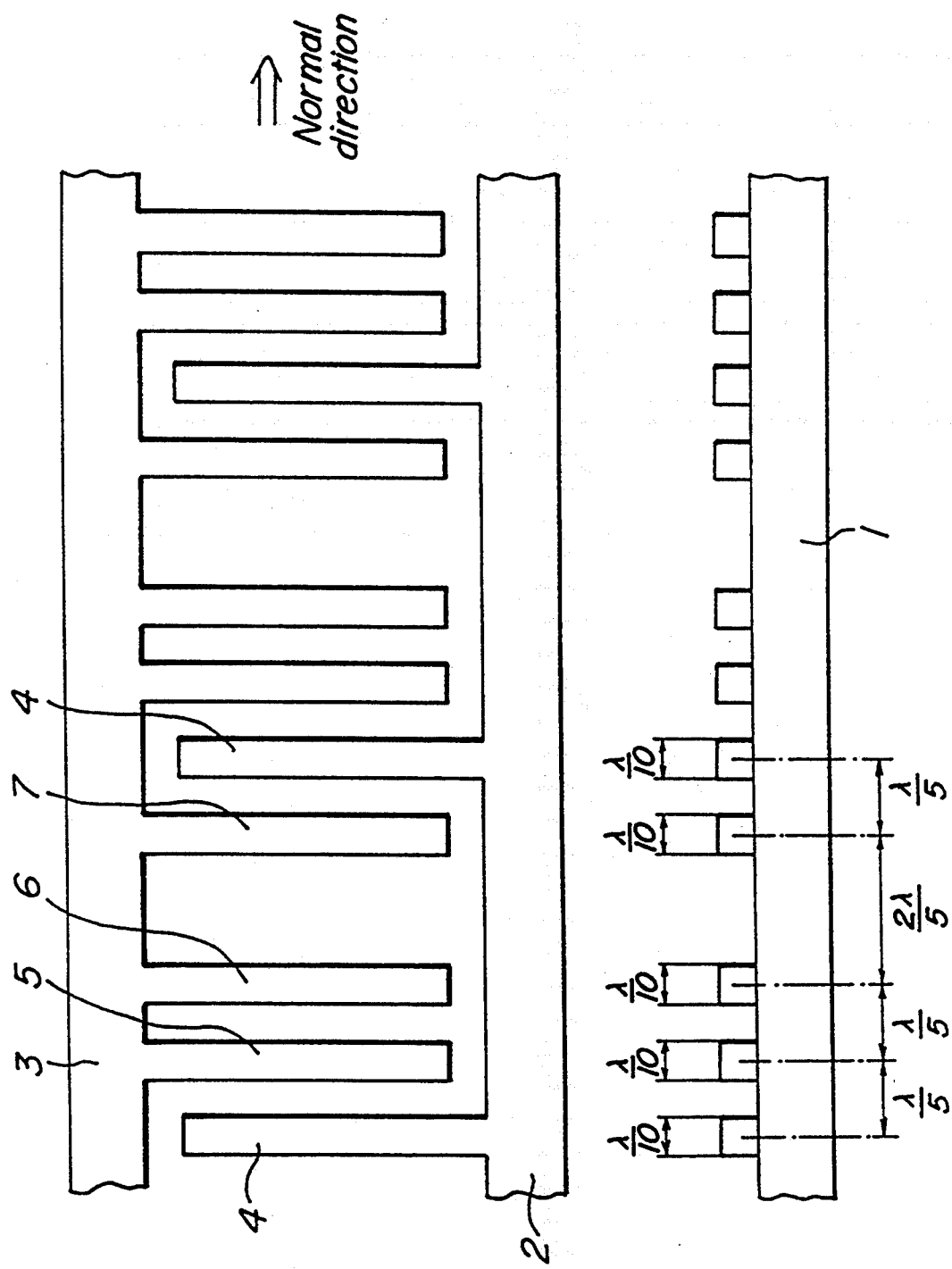
FIGS. 1A and 1B are respectively plan view and cross-sectional view of the electrode structure, showing a first embodiment of unidirectional transducer for the surface acoustic wave filter device according to the present invention.

A first embodiment of the interdigital-type unidirectional transducer according to the present invention is shown in FIGS. 1A and 1B. The transducer is formed by periodically arranging a positive electrode finger 4 with a width $\lambda/10$, a negative electrode finger 5 with a width of $\lambda/10$ spaced from the positive electrode finger 4 by a center distance $\lambda/5$, a negative electrode finger 6 of a width $\lambda/10$ spaced from the negative electrode finger 5 by a center distance $\lambda/5$, a negative electrode finger 7 of a width $\lambda/10$ spaced from the negative electrode finger 6 by a center distance $2\lambda/5$, and a positive electrode finger 4 with a width $\lambda/10$ spaced from the negative electrode finger 7 by a center distance $\lambda/5$, where $\lambda$ is the wave length of the fundamental surface acoustic wave at the fundamental operational frequency. In this instance, said center distances and said electrode finger widths may be within a range of $\pm 20\%$.

Figure 2:
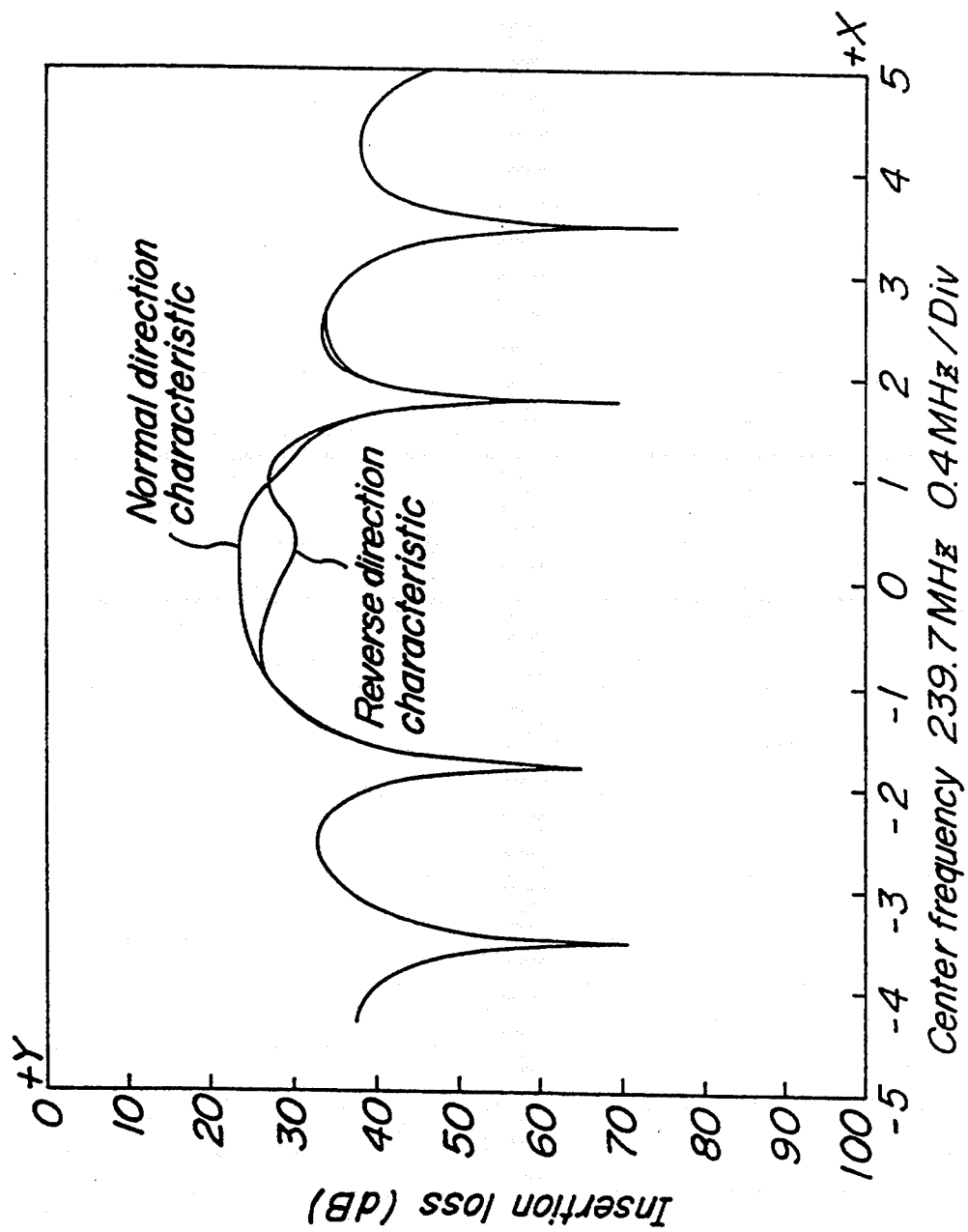
FIG. 2 is a graph showing the frequency characteristic of the unidirectional transducer of FIGS. 1A and 1B.

A simulation test has been performed with respect to the frequency characteristic of the filter device with the arrangement of the unidirectional surface acoustic wave transducers shown in FIGS. 1A and 1B. The result of the simulation test is shown in FIG. 2.

Figure 3:
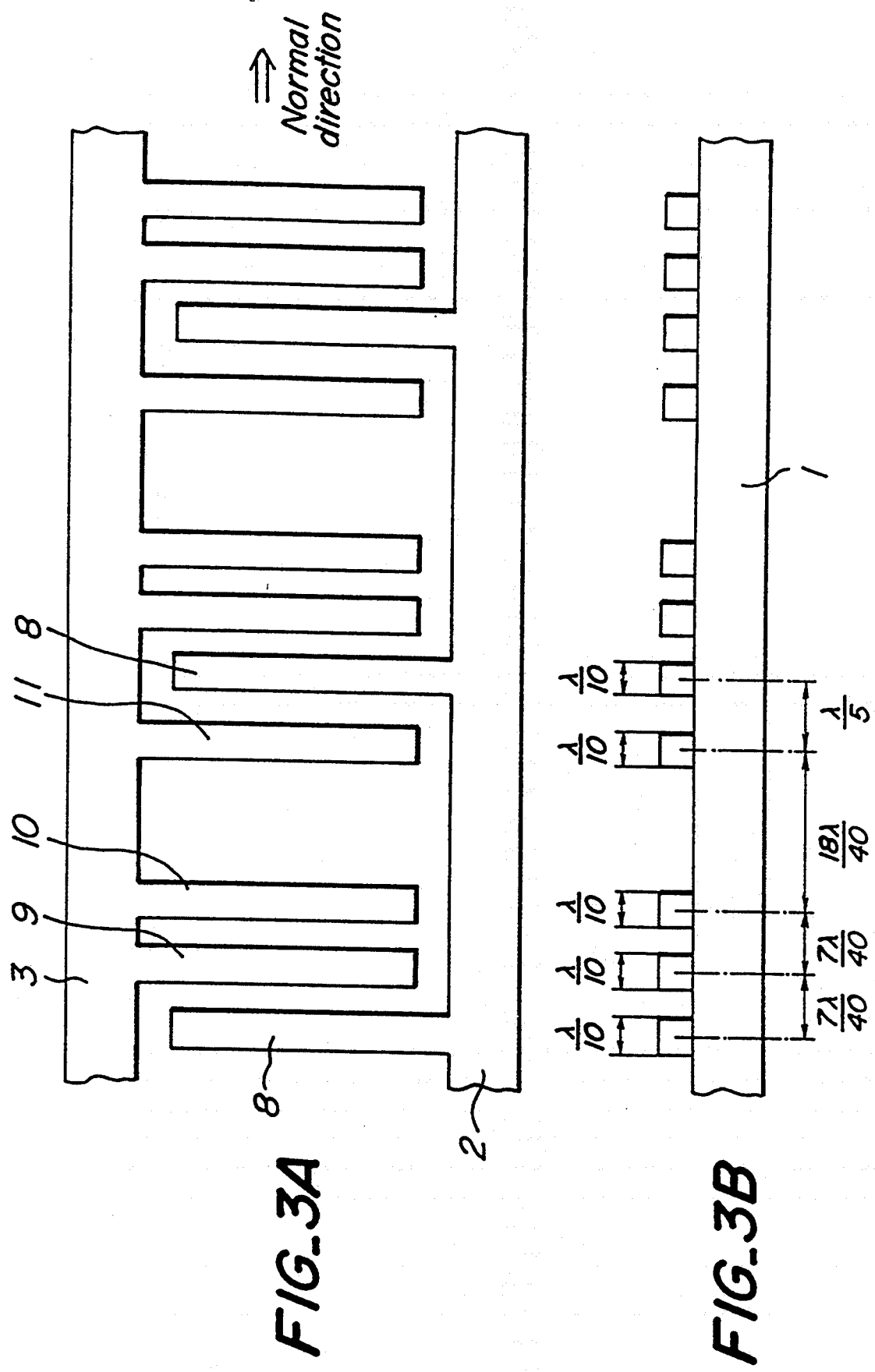
FIGS. 3A and 3B are respectively plan view and cross-sectional view of the electrode structure showing a second embodiment of the unidirectional transducer according to the present invention.

A second embodiment of the unidirectional surface acoustic wave transducer according to the present invention is shown in FIGS. 3A and 3B. The transducer includes interdigital-type electrodes formed by periodically arranging a positive electrode finger 8 with a width $\lambda/10$, a negative electrode finger 9 with a width $\lambda/10$ spaced from the positive electrode finger 8 by a center distance $7\lambda/40$, a negative electrode finger 10 of a width $\lambda/10$ spaced from the negative electrode finger 9 by a center distance $7\lambda/40$, a negative electrode finger 11 of a width $\lambda/10$ spaced from the negative electrode finger 10 by a center distance $18\lambda/40$, and a positive electrode finger 8 with a width $\lambda/10$ spaced from the negative electrode finger 11 by a center distance $\lambda/5$. In this instance, said center distance and said electrode finger widths may be within a range of $\pm 20\%$.

Figure 4:
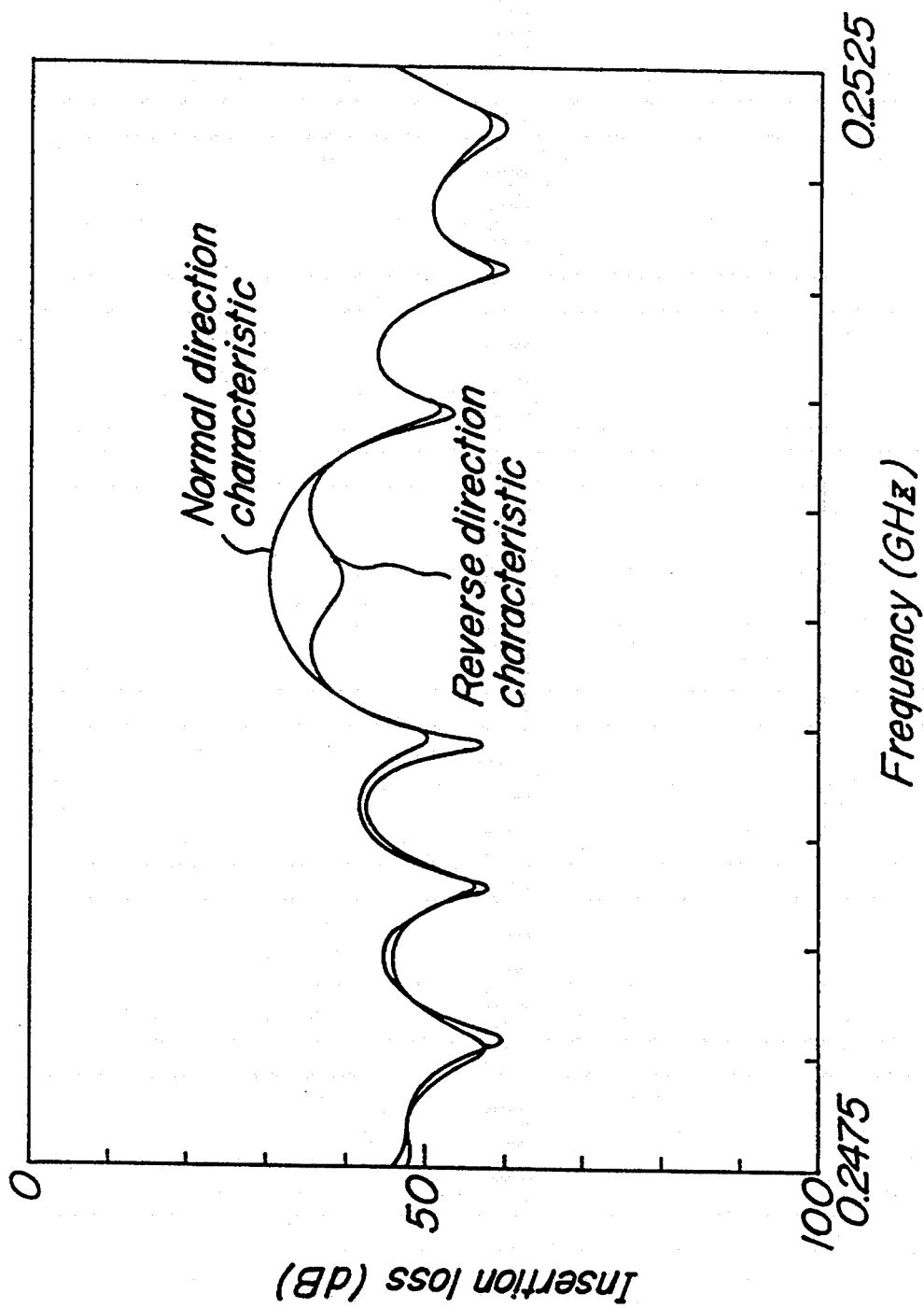
FIG. 4 is a graph showing the frequency characteristic of the unidirectional transducer of FIGS. 3A and 3B.

An experimental test has been performed with respect to the frequency characteristic of the filter device with the arrangement of the unidirectional surface acoustic wave transducers shown in FIGS. 3A and 3B. The result of the experimental test is shown in FIG. 4.

Figure 5:
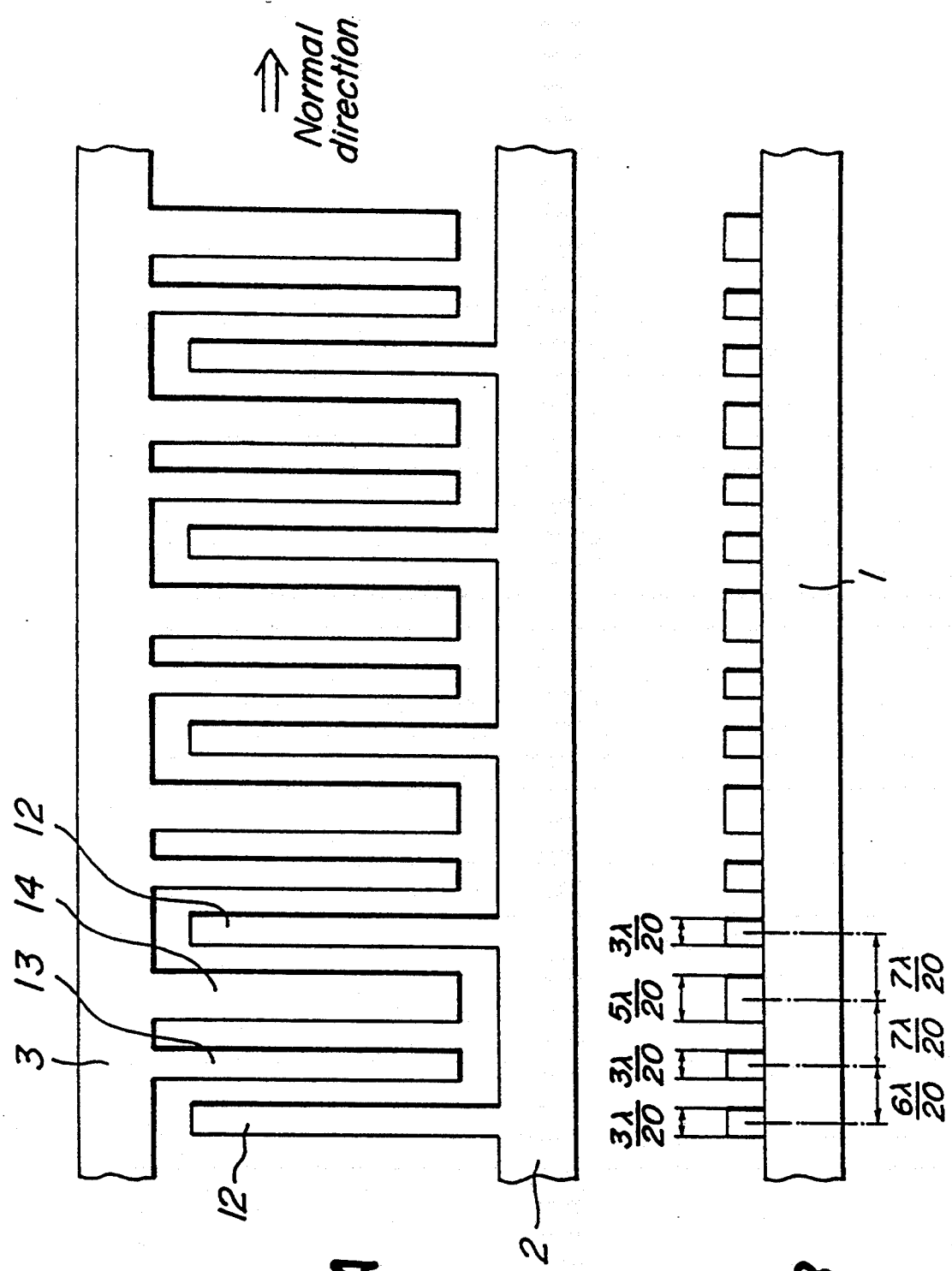
FIGS. 5A and 5B are respectively plan view and cross-sectional view of the electrode structure showing a third embodiment of the unidirectional transducer according to the present invention.

A third embodiment of the unidirectional surface acoustic wave transducer according to the present invention is shown in FIGS. 5A and 5B. The transducer includes interdigital-type electrodes formed by periodically arranging a positive electrode finger 12 with a width $3\lambda/20$, a negative electrode finger 13 with a width $3\lambda/20$ spaced from the positive electrode finger 12 by a center distance $6\lambda/20$, a negative electrode finger 14 of a width $5\lambda/20$ spaced from the negative electrode finger 13 by a center distance $7\lambda/20$, and a positive electrode finger 12 of a width $3\lambda/20$ spaced from the negative electrode finger 14 by a center distance $7\lambda/20$. In this instance, said center distances and said electrode finger widths may be within a range of $\pm 20\%$.

Figure 6:
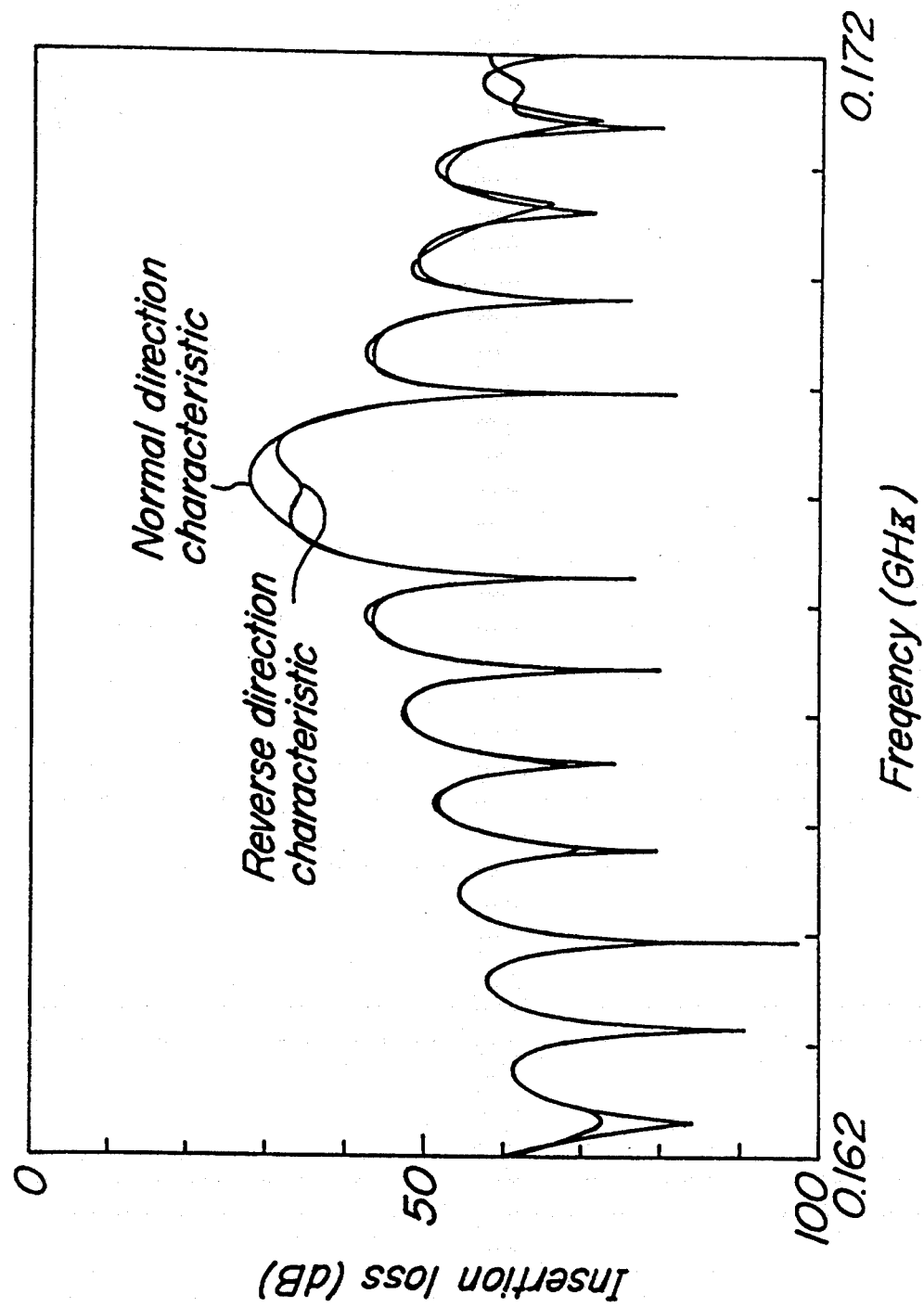
FIG. 6 is a graph showing the frequency characteristic of the unidirectional transducer of FIGS. 5A and 5B.

An experimental test has been performed with respect to the frequency characteristic of the filter device with the arrangement of the unidirectional surface acoustic wave transducers shown in FIGS. 5A and 5B. The result of the experimental test is shown in FIG. 6.

Figure 7:
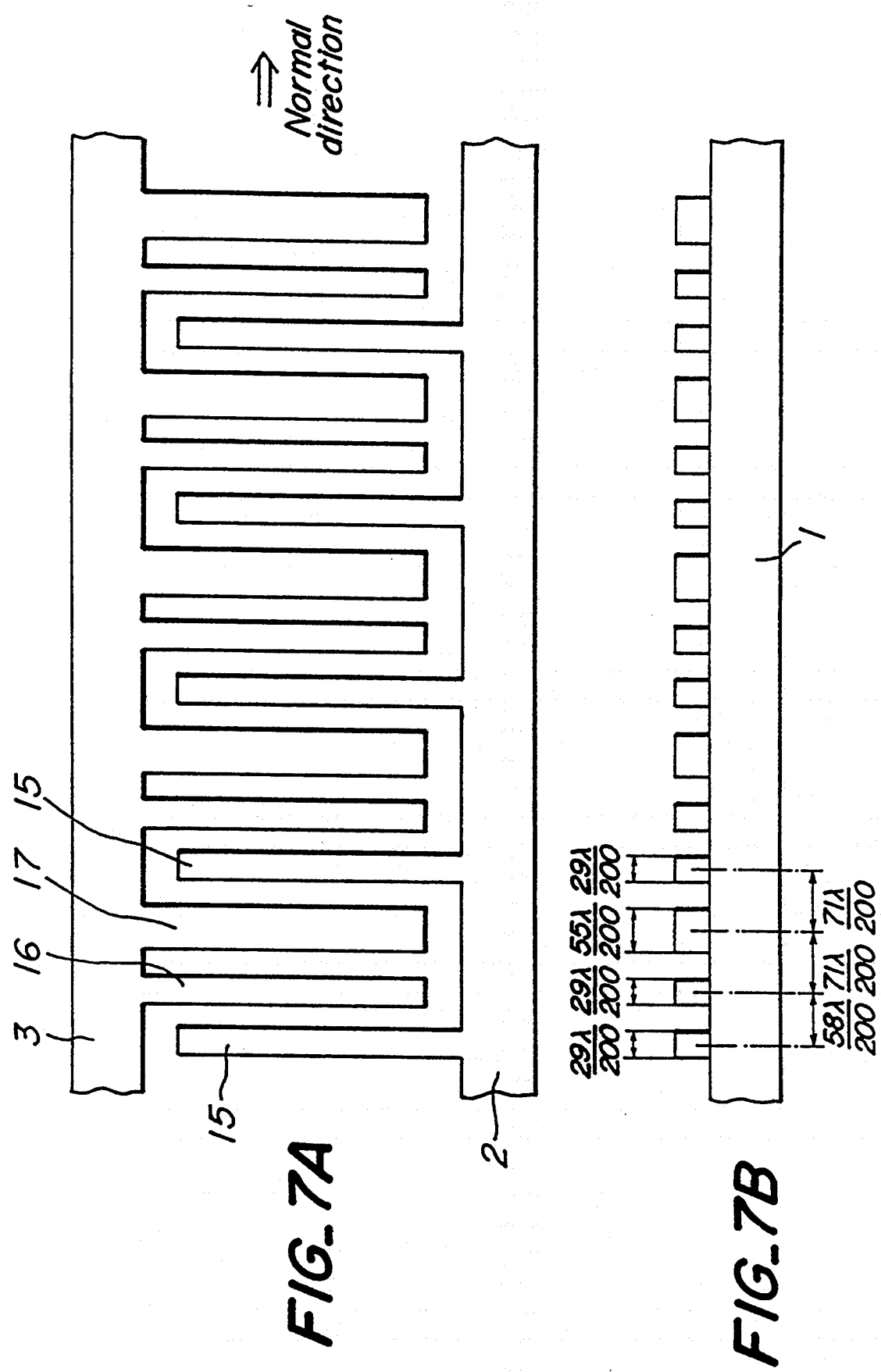
FIGS. 7A and 7B are respectively plan view and cross-sectional view of the electrode structure showing a fourth embodiment of the unidirectional transducer according to the present invention.

A fourth embodiment of the unidirectional surface acoustic wave transducer according to the present invention is shown in FIGS. 7A and 7B. The transducer includes interdigital-type electrodes formed by periodically arranging a positive electrode finger 15 with a width $29\lambda/200$, a negative electrode finger 16 with a width $29\lambda/200$ spaced from the positive electrode finger 15 by a center distance $29\lambda/100$, a negative electrode finger 17 of a width $55\lambda/200$ spaced from the negative electrode finger 16 by a center distance $71\lambda/200$, and a positive electrode finger 15 with a width $29\lambda/200$ spaced from the negative electrode finger 16 by a center distance $71\lambda/200$. In this instance, said center distances and said electrode finger widths may be within a range of $\pm 20\%$.

Figure 8:
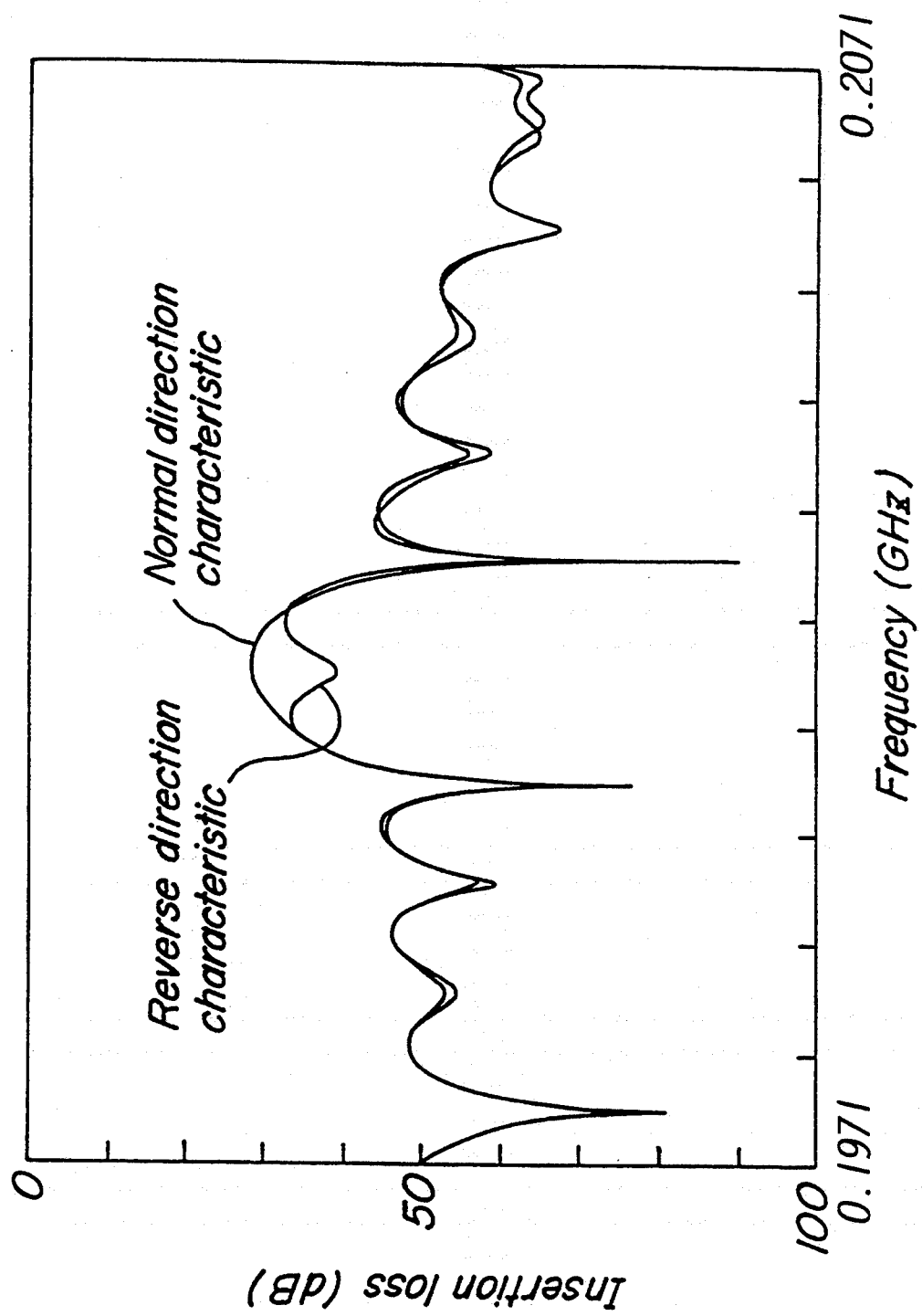
FIG. 8 is a graph showing the frequency characteristic of the unidirectional transducer of FIGS. 7A and 7B.

An experimental test has been performed with respect to the frequency characteristic of the filter device with the arrangement of the unidirectional surface acoustic wave transducers shown in FIGS. 7A and 7B. The result of the experimental test is shown in FIG. 8.

Figure 9:
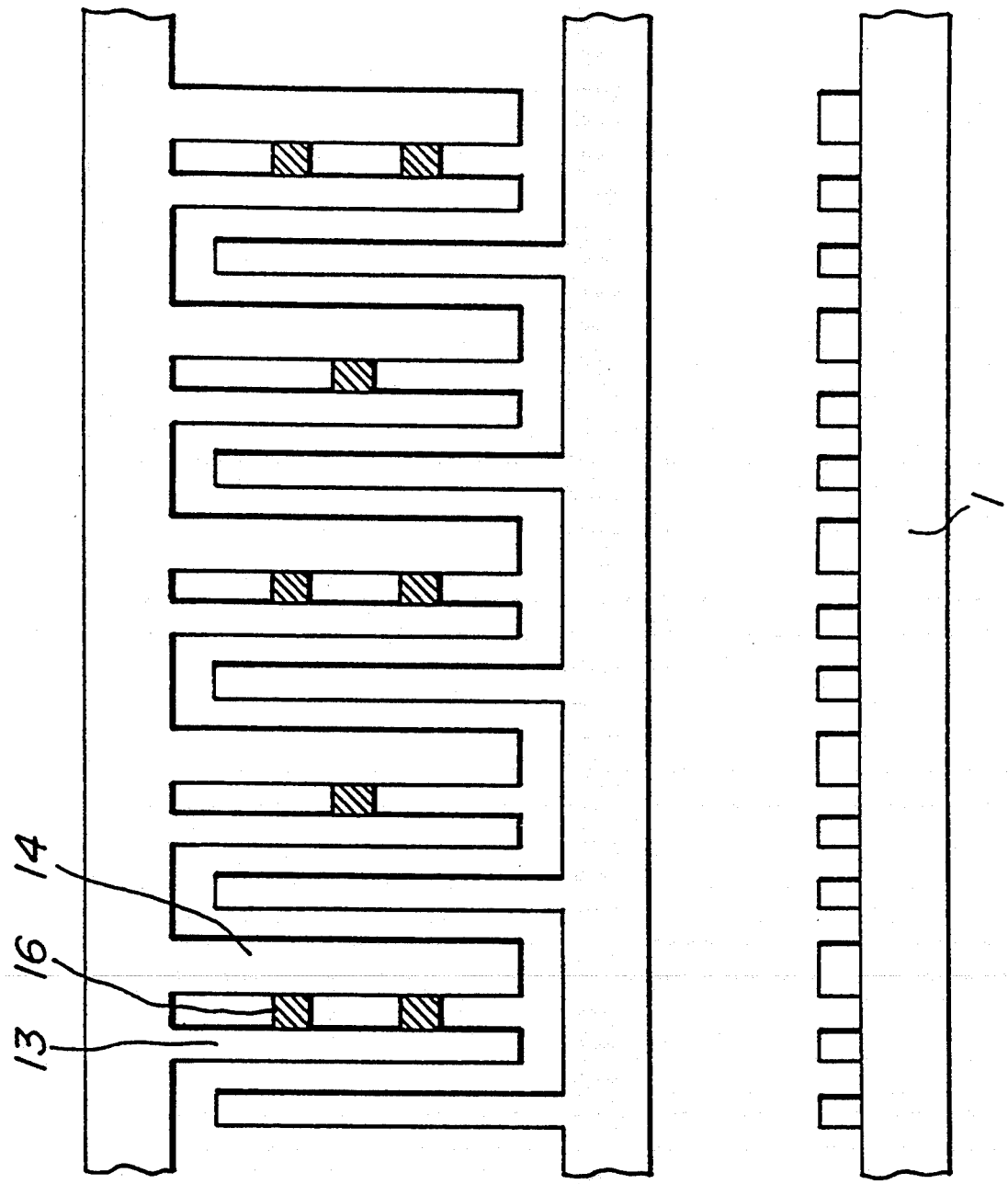
FIGS. 9A and 9B are respectively plan view and cross-sectional view of the electrode structure showing a fifth embodiment of the unidirectional transducer according to the present invention.

A fifth embodiment of the unidirectional surface acoustic wave transducer according to the present invention is shown in FIGS. 9A and 9B. The transducer includes interdigital-type electrodes 13 and 14 which are of the same electrode film thickness and the same material, and which are partially connected to each other by connecting elements 16 for controlling the unidirectional degree of the internal reflector.

In the embodiments thus far described, it is not necessary for the electrode finger widths and the center distances to be accurately at the above-mentioned values, provided that each wave phase becomes in-phase at a center frequency. In consideration of the band width of the interdigital electrode transducer, the range of $\pm 20\%$ is considered suitable.

The internal reflection-type unidirectional surface acoustic wave transducer of the above-mentioned embodiments may be combined with a bidirectional surface acoustic wave transducer which is formed at the center of the substrate. In this instance, the unidirectional transducers with above structure are arranged on both sides of the bidirectional transducer with an orientation whereby the wave energy in increased toward the center.

In the above explanation, the lower side and the upper side of the plan view were defined as the positive electrode 2 and the negative electrode 3, respectively. However, it is also possible to change the polarity of the negative electrode and the positive electrode.

Figure 10:
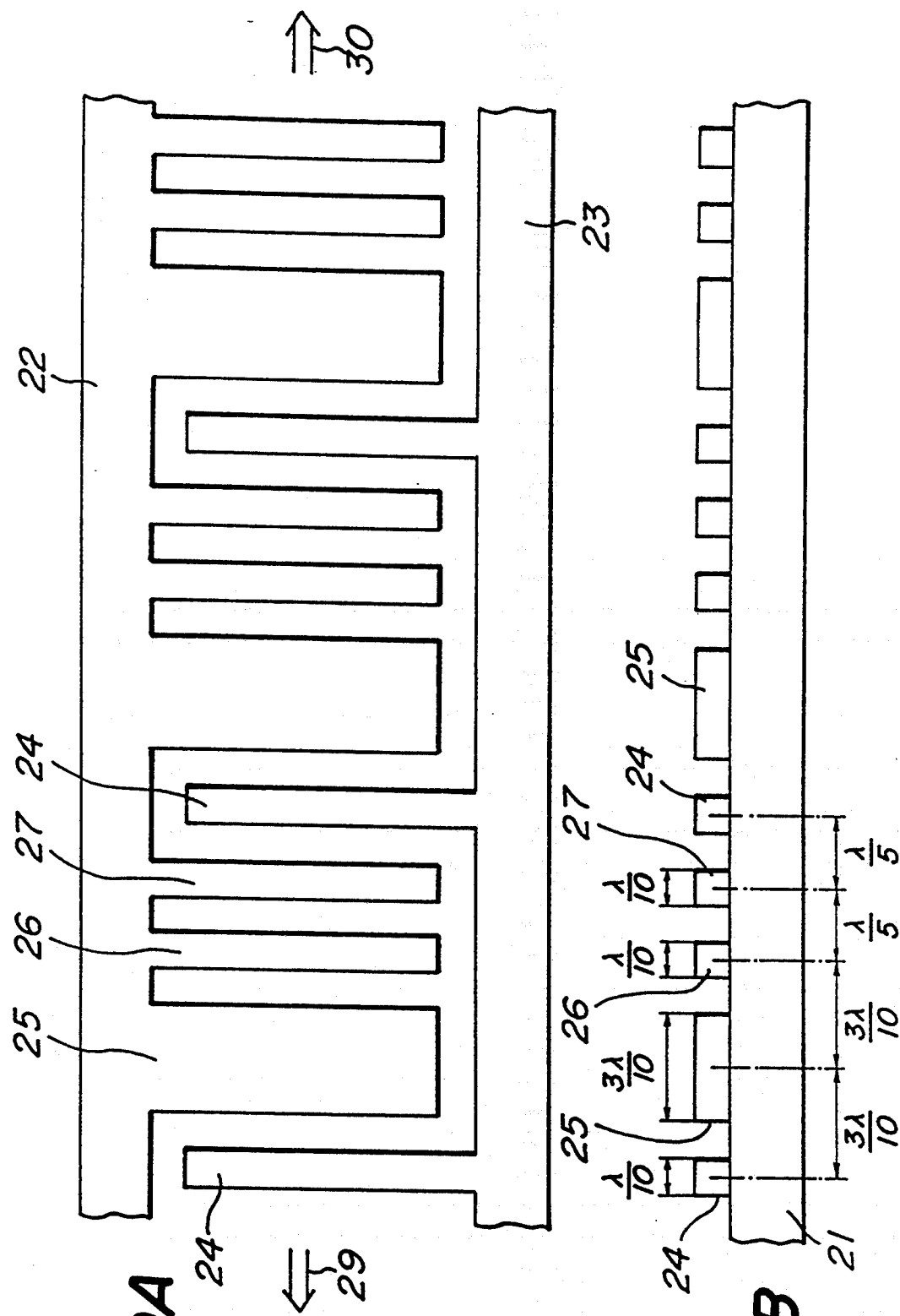
FIGS. 10A and 10B are respectively plan view and cross-sectional view of the electrode structure showing a sixth embodiment of the unidirectional transducer according to the present invention.

A sixth embodiment of the unidirectional surface acoustic wave transducer according to the present invention is shown in FIGS. 10A and 10B, wherein the substrate is denoted by reference numeral 21, and the negative electrode and the positive electrode are denoted by reference numerals 22, 23, respectively. The transducer includes interdigital-type electrodes formed by periodically arranging a positive electrode finger 24 with a width $\lambda/10$, a negative electrode finger 25 with a width $3\lambda/10$ spaced from the positive electrode finger 24 by a center distance $3\lambda/10$, a negative electrode finger 26 with a width $\lambda/10$ spaced from the negative electrode finger 25 by a center distance $3\lambda/10$, a negative electrode finger 27 of a width $\lambda/10$ spaced from the negative electrode finger 26 by a center distance $\lambda/5$, and a positive electrode finger 24 with a width $\lambda/10$ spaced from the negative electrode finger 27 by a center distance $\lambda/5$.

In this instance, it is unnecessary for the electrode finger widths and the center distances to be accurately the abovementioned values, provided that the phase of each wave becomes in-phase at the center frequency. In consideration of the bandwidth of the interdigital-type transducer, it is suitable that the value is within the range of ±80%.

Figure 11:
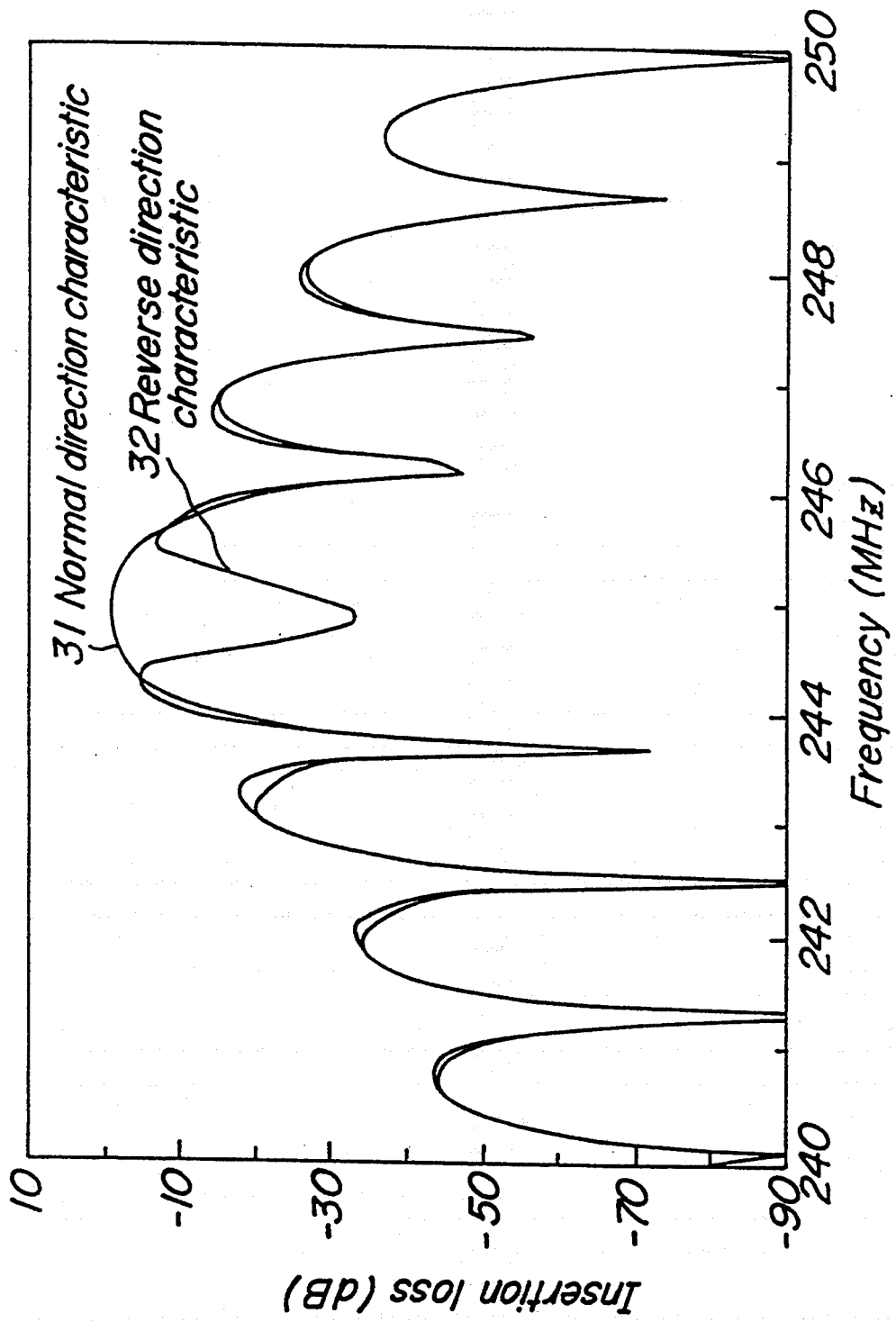
FIG. 11 shows one example of the calculated results on the filter device according to the present invention wherein the unidirectional transducers of FIGS. 10A and 10B are formed on a GaAs substrate.
Figure 12:
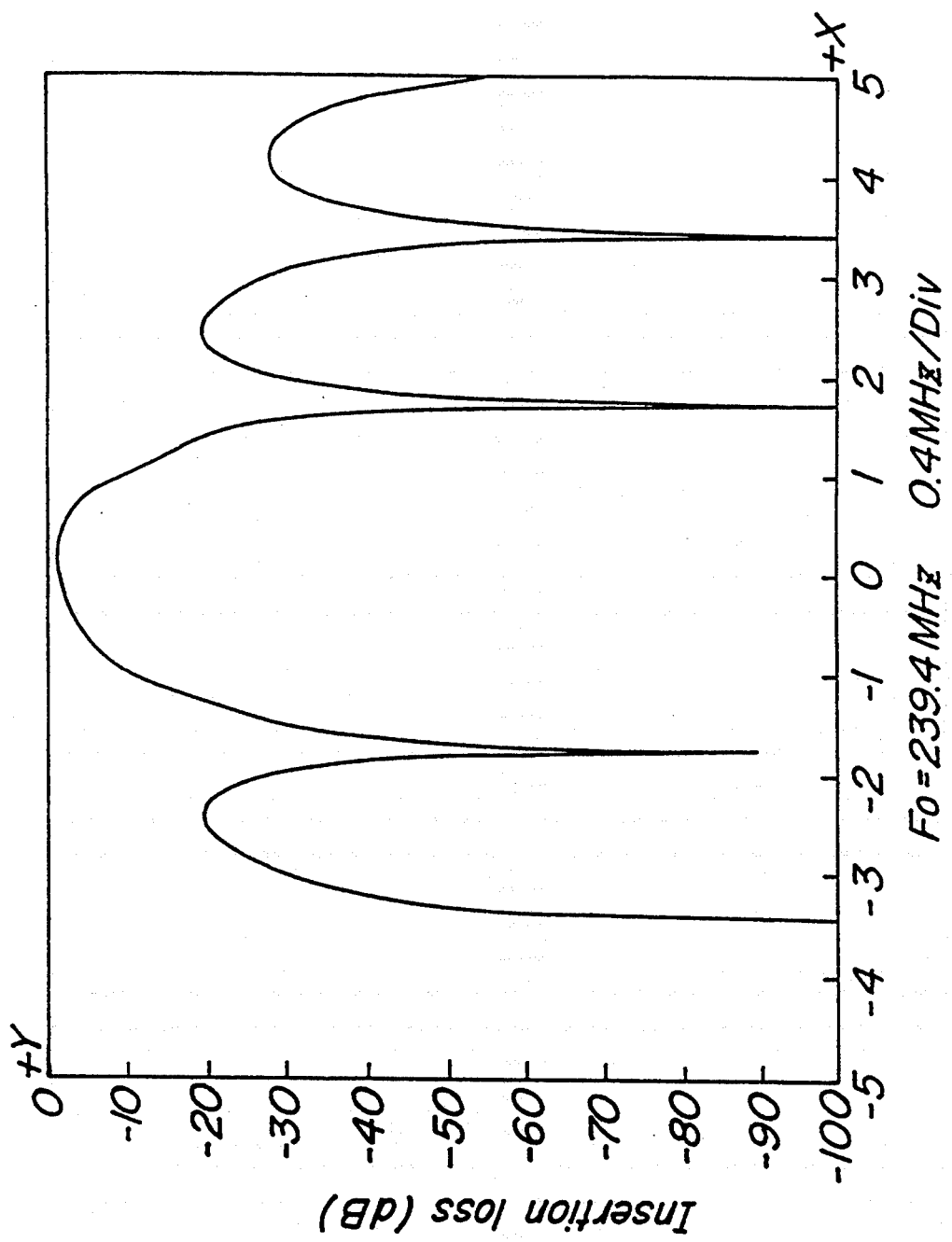
FIG. 12 shows another example of the calculated results on the filter device according to the present invention wherein the unidirectional transducers of FIGS. 10A and 10B are formed on a quartz substrate.
Figure 13:
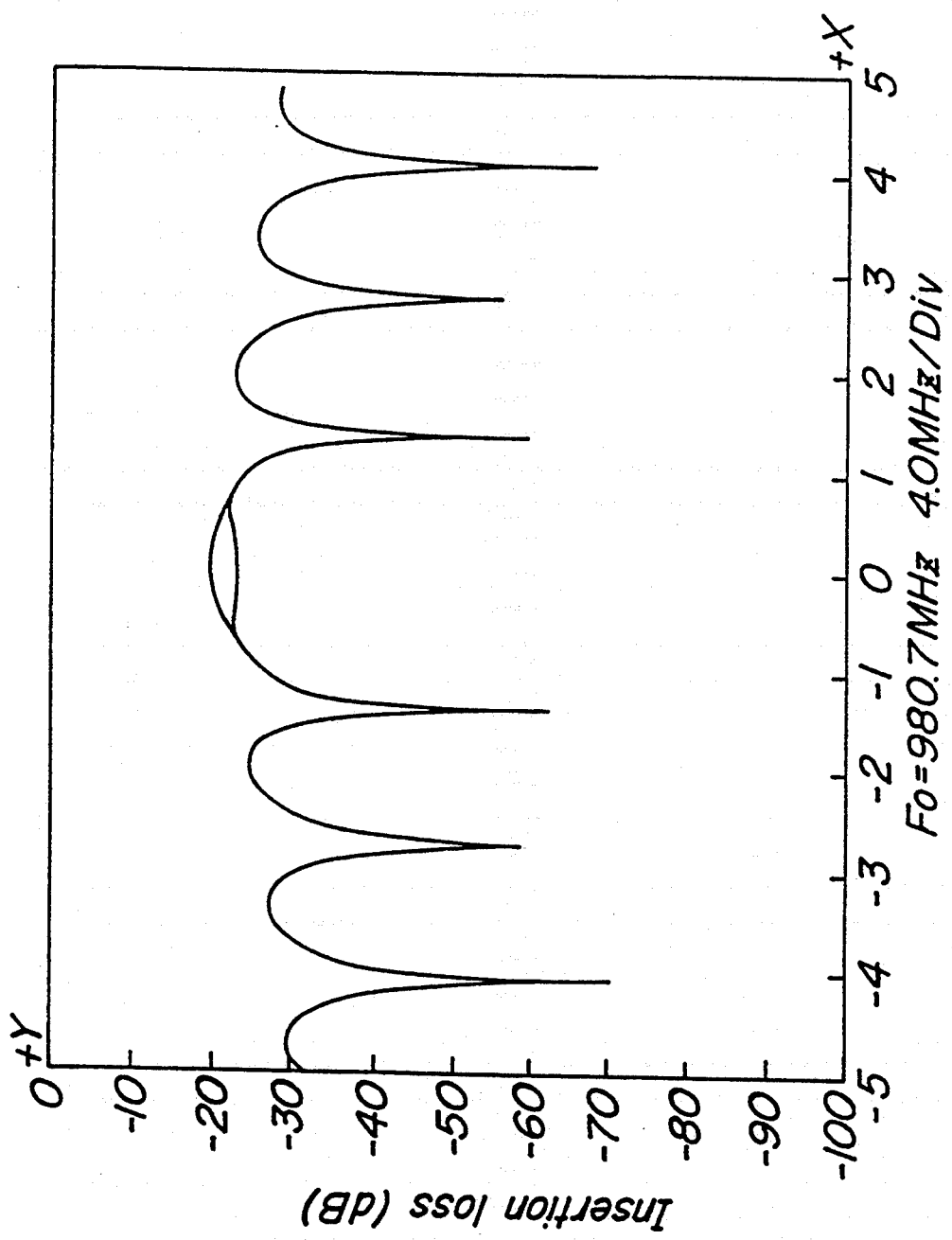
FIG. 13 shows still another example of the calculated results on the unidirectional characteristics of the filter device according to the present invention wherein the unidirectional transducers of FIGS. 10A and 10B are formed on a LiNbO$_3$ substrate.

The calculated result for the second harmonic in the case of the unidirectional surface acoustic wave transducer according to the embodiment of FIGS. 10A and 10B is shown in FIGS. 11 to 13.

FIG. 11 shows one example whereby a low insertion loss has been obtained by arranging the unidirectional transducers on a GaAs substrate in the direction facing the directional properties of each other. The normal direction is shown by arrow 29 in FIG. 10A. The length of the electrode finger L is $200\lambda_2$ where $\lambda_2$ is the wavelength of the second harmonic wave. In FIG. 11, reference numeral 31 shows the normal direction characteristics, and its insertion loss is 0.5 dB.

FIG. 12 shows another example whereby a low insertion loss has been obtained by arranging the unidirectional transducers on a quartz substrate in the direction facing each other. In this case, the length of the electrode finger L is $350\lambda_2$, and the insertion loss is 1.0 dB. The normal direction is shown by arrow 30 in FIG. 10A.

FIG. 13 shows the result of the directional property when using $LiNbO_3$ substrate provided with the abovementioned unidirectional transducers. In conjunction with the length of the electrode finger which is as small as $90\lambda_2$, the directional property is also small as 3.6 dB.

Figure 14:
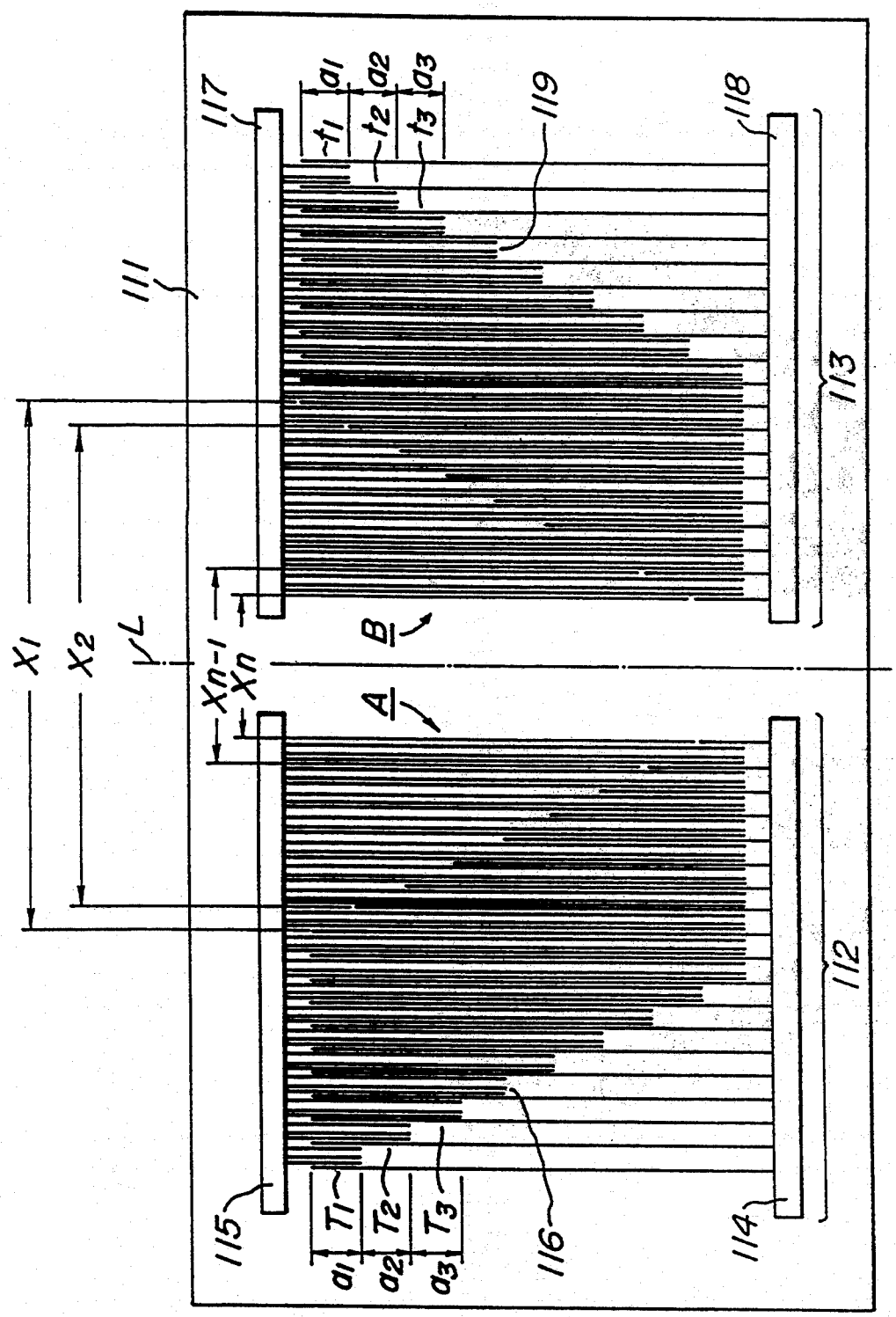
FIG. 14 is a diagram showing the structure of an embodiment of the surface acoustic wave filter device according to the present invention.
Figure 15:
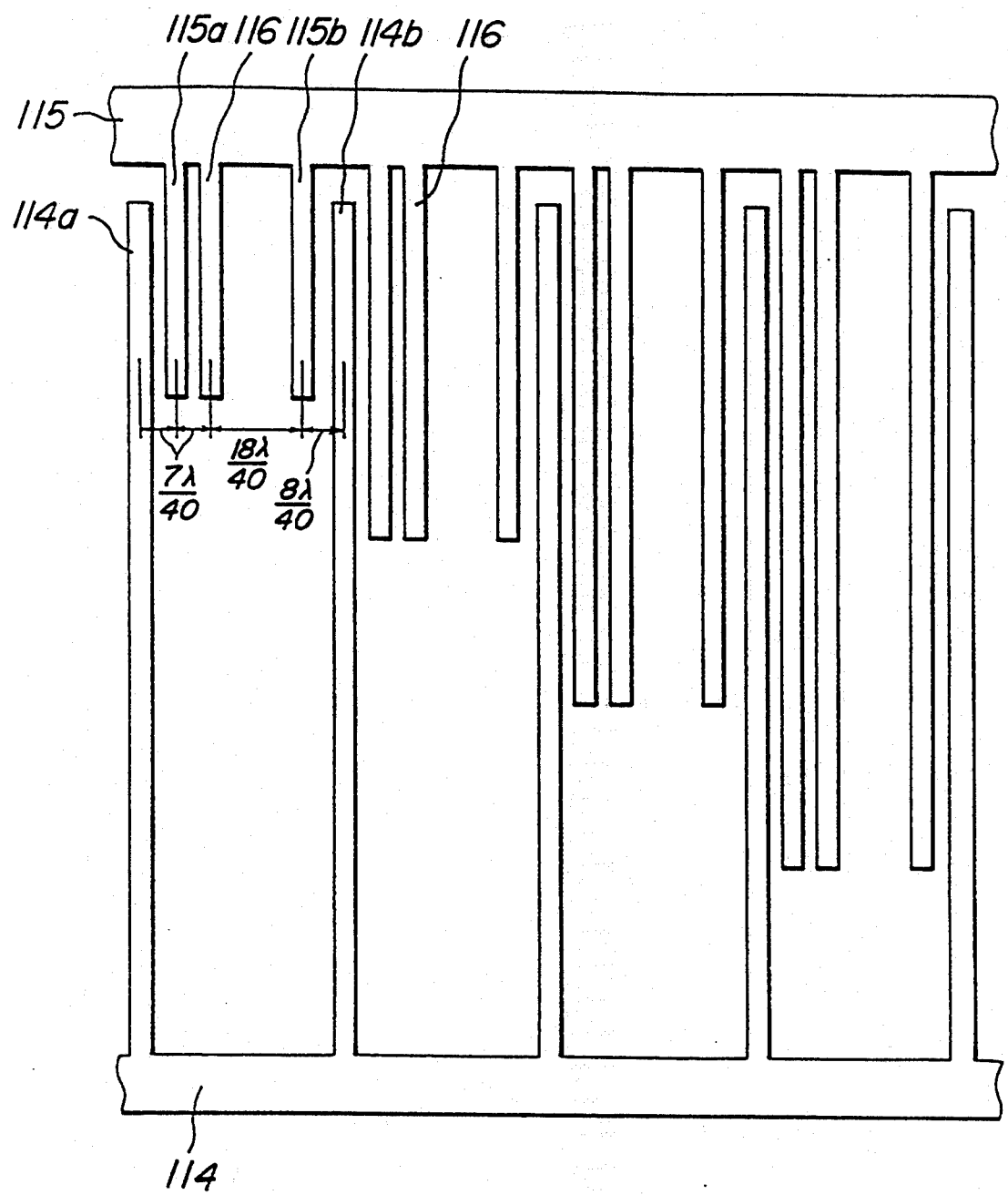
FIG. 15 is a diagram showing in detail a part of an input-side transducer.

There is shown in FIGS. 14 and 15 a structural example of the surface acoustic wave filter device according to still another embodiment of the present invention. FIG. 14 is a plan view showing the entire structure and FIG. 15 is a plan view showing part of FIG. 14 in an enlarged scale.

The filter device includes a piezoelectric substrate 111 comprising quartz, and an input-side transducer 112 and an output-side transducer 113 both formed on the substrate 111. According to the present embodiment, the input-side and the output-side transducers are constituted of unidirectional transducers which suppress excitation and reception level of the fundamental wave, and amplifies and converts the second harmonic wave. The input-side and the output-side transducers are arranged symmetrically with respect to the center line L perpendicular to the propagation direction of the acoustic surface-wave. Since the input-side and the output-side transducers have the same electrode structure, the input-side transducer will be explained as an example of the electrode structure.

As shown in FIG. 15, the input-side transducer 112 includes an interdigital-type positive electrode 114, an interdigital-type negative electrode 115, and a shunt-type floating electrode 116 arranged between the positive and the negative electrodes. Each electrode finger of the positive electrode 114 is formed with a pitch $\lambda$.

The two electrode fingers 115a and 115b of the negative electrode 15 are formed between the two electrode fingers 114a and 114b of the positive electrode 114 which are adjacent to each other. The electrode fingers of the floating electrode 116 are formed between the electrode fingers of the negative electrodes. The electrode finger of the floating electrode 116 is formed between the two negative electrode fingers 115a and 115b and establishes only a mechanical reflection effect without carrying out any excitation operation. Hence the floating electrode 116 performs the same function as that of a normal floating electrode which is electrically in a floated state. Therefore, the floating electrode 116 becomes shunt-type where respective electrode fingers are electrically connected to each other by way of the negative electrode 115. In the present specification, the floating electrode may be either one type which is electrically in a floated state, and another type in which respective electrode fingers are electrically connected to each other via the positive or negative electrode.

The center distance between the electrode finger 114a of the positive electrode 114 and the electrode finger 115a of the negative electrode 115 is $7\lambda/40$. The center distance between the other electrode finger 114b of the positive electrode 114 and the other electrode finger 115b of the negative electrode 115 is $8\lambda/40$. The electrode finger of the floating electrode 116 is formed to have a center distance $14\lambda/40$ with reference to the electrode finger 114a of the positive electrode. For example, in the case of an surface acoustic wave filter device having a passband width of an intermediate frequency of 240 MHz, the wavelength $\lambda$ of the fundamental surface acoustic wave is approximately 26.3 $\mu$m.

As shown in FIG. 14, the positive electrode, the negative electrode and the floating electrode of the input-side transducer 112 and the output-side transducer 113 are arranged in accordance with the weighting method. The region where the positive electrode 114, the negative electrode 115 and the floating electrode 116 of the input-side transducer 112 are formed defines an exciting area which is divided into a plurality of tracks $T_1, T_2, T_3, \ldots, T_{n-1}, T_n$. Each of the tracks extends in the propagation direction of the acoustic surface-wave. In each of the tracks, the floating electrode 116 is arranged between the adjacent electrode fingers of the positive electrode 114 and the negative electrode 115. Similarly, in the output-side transducer, the region where the positive electrode 117, the negative electrode 118, and the floating electrode 119 are formed constitutes a receiving area which is divided into a plurality of tracks $t_1, t_2, t_3, \ldots, t_{n-1}, t_n$. In the present specification, the distance between the track Ti of the input-side transducer 12 and the corresponding track ti of the output-side transducer 13 is defined as a track length $x_i$. The track length $x_i$, as shown in FIG. 14, may be defined as the distance between the electrode fingers of the innermost side of each track. The length xi of the tracks vary in a linear manner. That is, the difference $(x_i - x_{i-1})$ $(2 \leq i \leq n)$ between the lengths of adjacent tracks is set to a constant value which is $\lambda/2$ multiplied by an integer. Moreover, the track width which is in the direction perpendicular to the propagation direction of the surface acoustic wave is defined. That is, the track widths of the tracks $T_1, T_2, \ldots, T_n$, and $t_1, t_2, \ldots, t_n$ are represented by $a_1, a_2, \ldots, a_n$. In this invention, the track widths $a_1, a_2, \ldots, a_n$ are defined in accordance with a desired function which may be an appropriate window function, such as Kaiser function, Hamming function, Hanning function, etc.

In the present embodiment, the track lengths $x_1, x_2, \ldots, x_n$ linearly reduce at a fixed distance $2\lambda$ and the track widths $a_1, a_2, \ldots, a_n$ change according to Kaiser function. Therefore, the track width is set at the maximum value in the central track and is gradually reduced as it goes toward the end portion of the track array.

Since the unidirectional transducer weighted in distance has the characteristic weighted depending on the distance between the transmission and reception portions and the aperture length, the side-lobe can be effectively suppressed in comparison with a transducer which does not add distance weighting. Moreover, the unidirectional transducer weighted in distance is advantageous in that the impedance at the input-side can be matched with the impedance at the output-side can be obtained, and further in that the number of electrode pairs can be reduced.

On the other hand, as shown in FIG. 14, there are non-excitation area A where only the electrode fingers of the negative electrode 115 of the input-side transducer 112 are formed, and non-receiving area B where only the electrode fingers of the positive electrode 117 of the output-side transducer 113 are formed. In the areas A and B, because the layout density of the electrode fingers is low, the propagation velocity becomes higher than the average propagation velocity in the excitation area and the receiving area. For that reason, the center frequency of the weighting function shifts so that a problem may arise that, in the frequency characteristics, the characteristic near the center frequency and the side-lobe at higher frequency side with reference to the center frequency become higher. In order to overcome such a problem, the occurrence of difference in the average propagation velocity of the surface acoustic wave is avoided by arranging dummy electrodes in the non-excitation area A and the non-receiving area B in which are arranged the electrode fingers of either a positive electrode or a negative electrode only.

Figure 16:
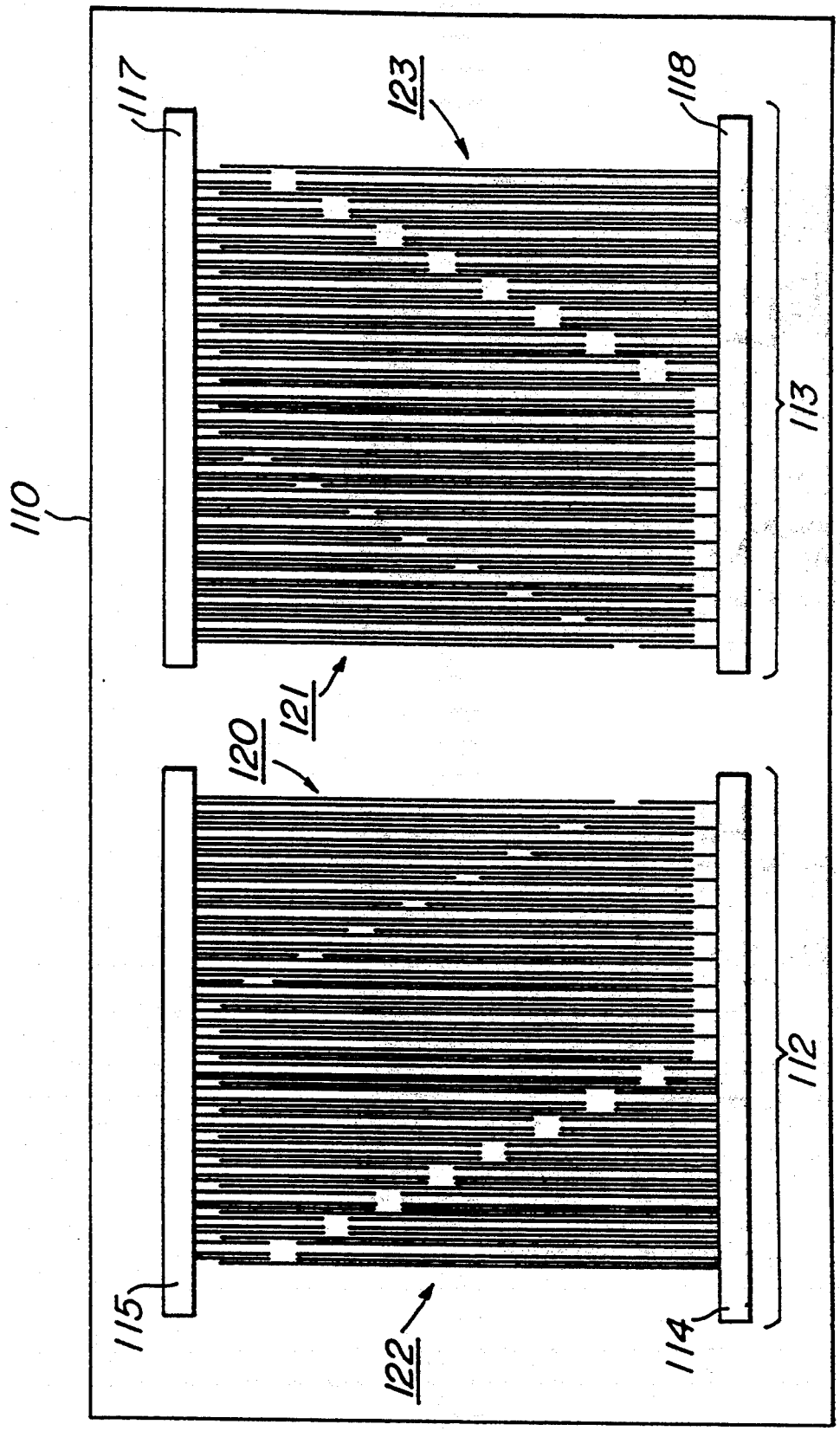
FIG. 16 is a diagram showing a modified example of the surface acoustic wave filter shown in FIG. 14.
Figure 17:
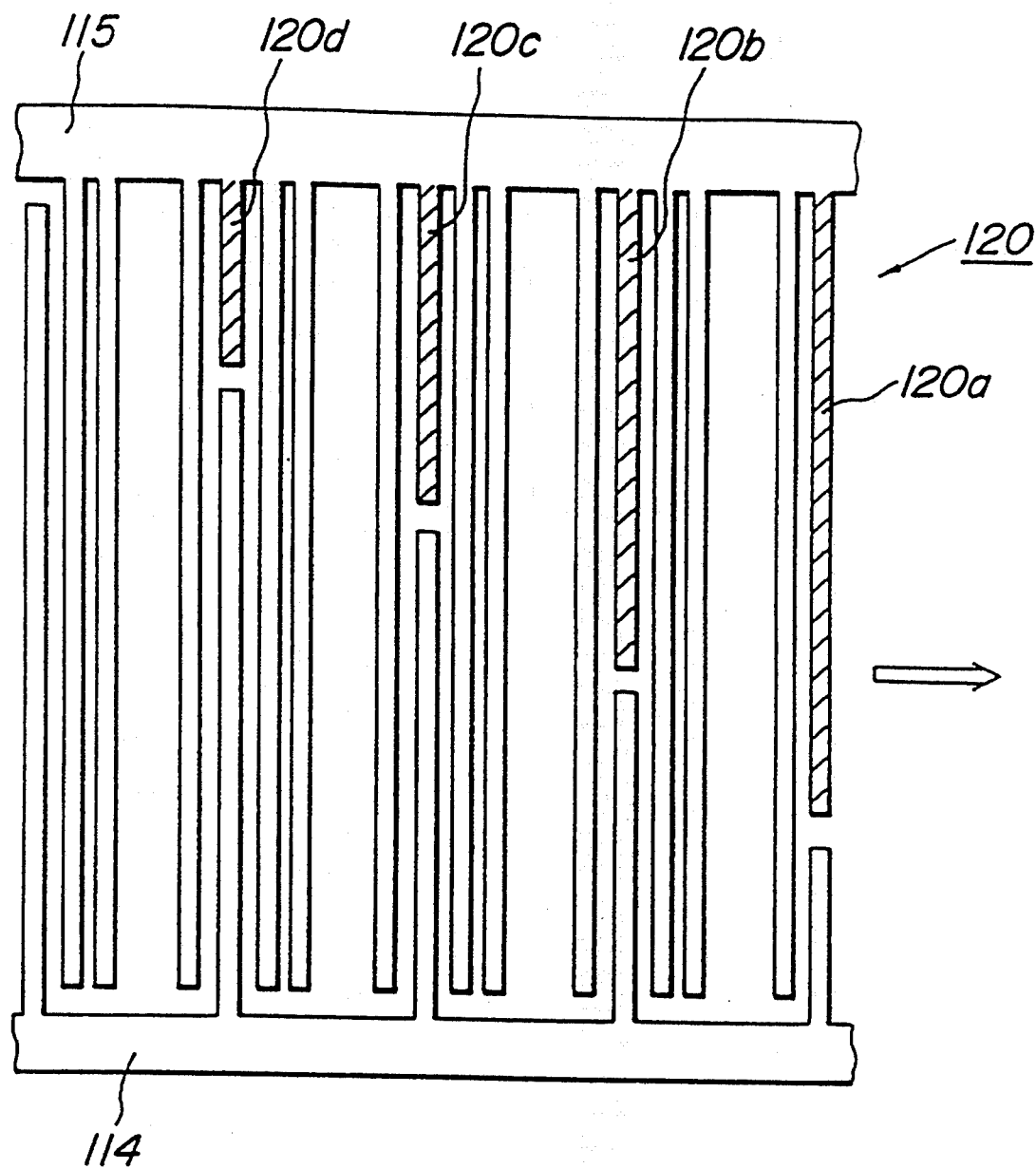
FIG. 17 is a diagram showing the layout constitution of a dummy electrode.

FIG. 16 shows the entire structure of the surface acoustic wave filter device where dummy electrode groups 120 and 121 are formed in the device of FIG. 14. A part of the input-side transducer is shown typically in FIG. 17. As shown in FIG. 17, the respective electrode fingers 120a to 120d of the dummy electrode group 120 (shown with hatched lines) are formed along the extended line of the electrode fingers of the positive electrode 114 and according to the lengths of the respective electrode fingers. By forming the dummy electrodes in this manner, the electrode fingers are present in uniform density in the area between the input-side transducer 112 and the output-side transducer 113. Thus, it is possible to avoid degradation of the side-lobe characteristic on higher frequency side due to the propagation velocity difference. Besides, the electrode fingers 120a to 120d of the dummy electrode are formed integrally with the negative electrode 115 and used as a shunt-type dummy electrode. In the case of the quartz substrate, the open-type floating electrode and the shunt-type floating electrode have the same sign of reflection coefficient to each other. It is thus possible to selectively use a dummy electrode of shunt-type or open-type. Moreover, in the present embodiment, the dummy electrode groups 122 and 123 are also formed respectively on the opposite side with respect to the side where the input-side transducer 112 confronts to the output-side transducer 113 shown in FIG. 17.

Figure 18:
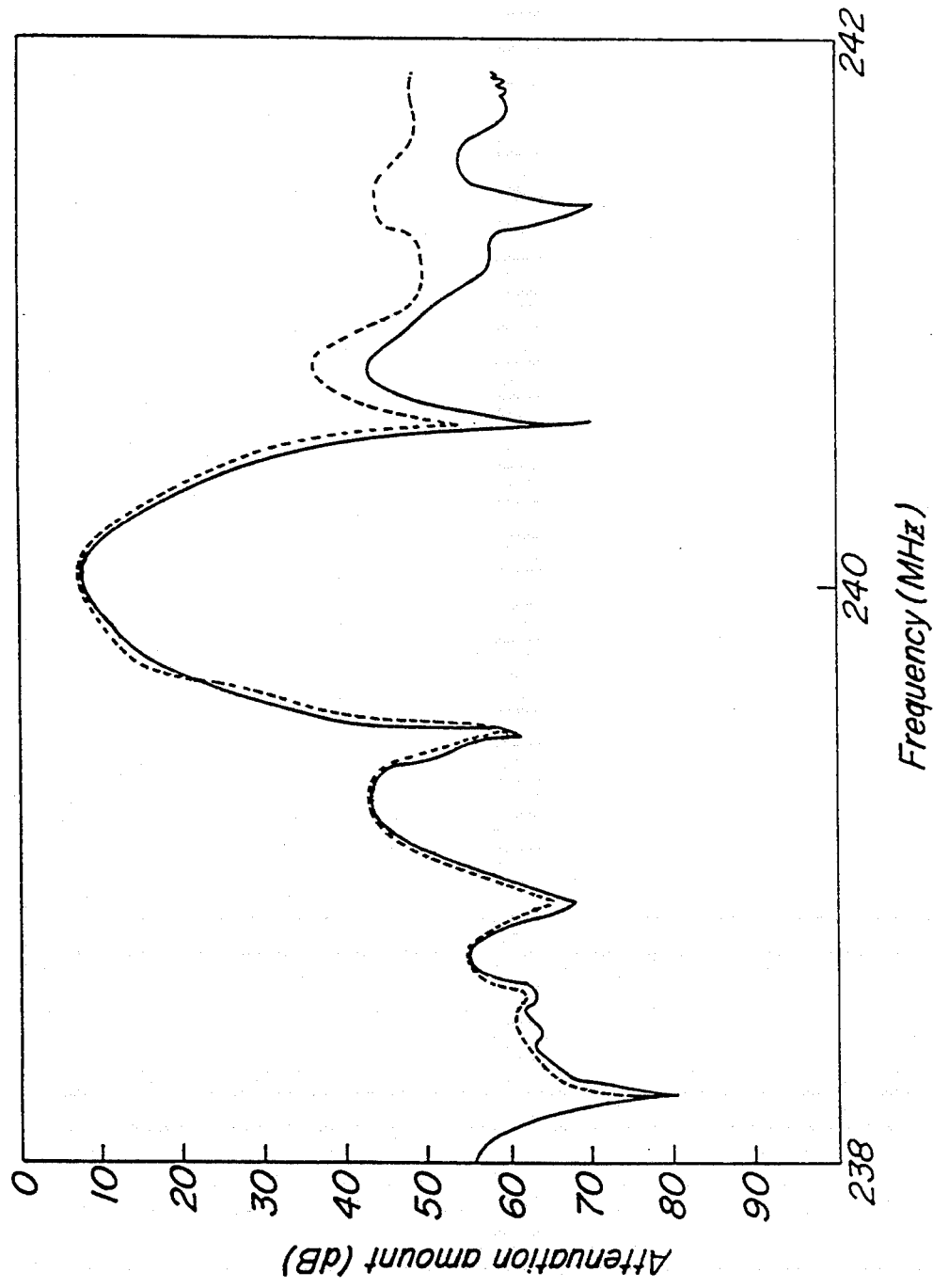
FIG. 18 is a graph showing a passband characteristic of the acoustic surface-wave filter shown in FIG. 14.

Explanation will be made of experiments performed with respect to the surface acoustic wave filter device according to above-mentioned two embodiments. The filter device having the structure shown in FIGS. 14 and 15 was formed on a quartz substrate and the attenuation characteristics were measured. In this case, the filter device with the center frequency of 240 MHz was set to $\lambda = 26.3$ $\mu$m. The results of the measurement are shown in FIG. 18. The broken line shows the measured result of a filter device without dummy electrodes, and the solid line shows the measured result of a filter device with the dummy electrodes. As appreciated from FIG. 18, in the both cases of the filter device with and without dummy electrodes, the insertion loss is suppressed to a lower value of 7 dB. When the dummy electrodes are not provided, the attenuation of the first side-lobe is approximately 30 dB. When the dummy electrodes are provided, the attenuation becomes to 37 dB to realize an excellent attenuation characteristics. From the results of the measurement, it is clear that a second harmonic wave is amplified and converted. Provision of the dummy electrodes serves to further improve the side-lobe characteristic on higher frequency with reference to the center frequency.

Explanation will be further made of modified embodiments of the input-side transducer and the output-side transducer. The structure of the transducer which can amplify and convert the second harmonic wave with respect to the fundamental wave has been found through simulation tests which will be explained with reference to FIGS. 19 to 25.

Figure 19:
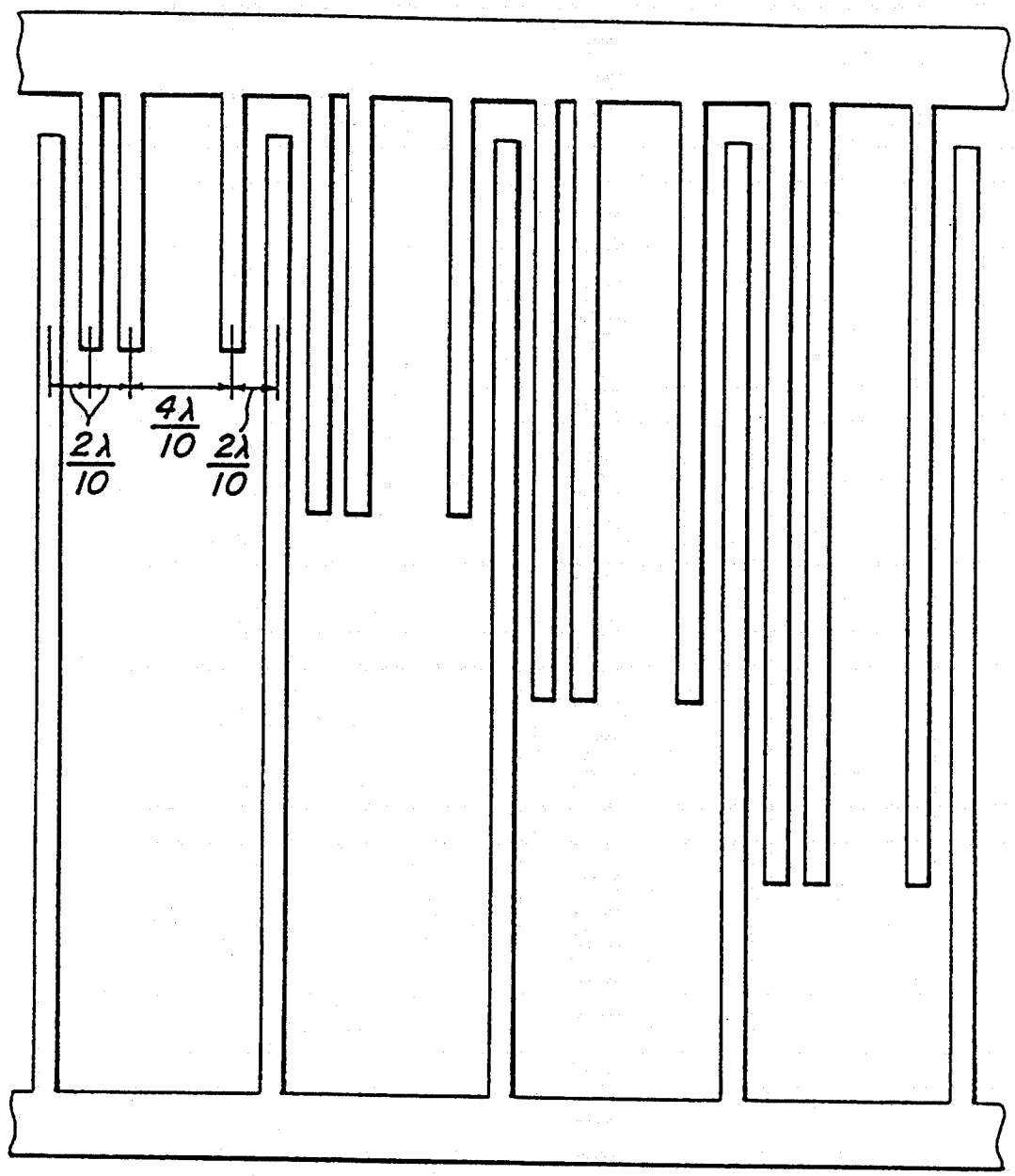

The transducer shown in FIG. 19 has a structure similar to that of the transducer shown in FIG. 15. There is only difference in that the pitch of the electrode fingers is set to $2\lambda/10$, $2\lambda/10$, $4\lambda/10$ and $2\lambda/10$ in serial order along the propagation direction of the surface acoustic wave.

Figure 20:
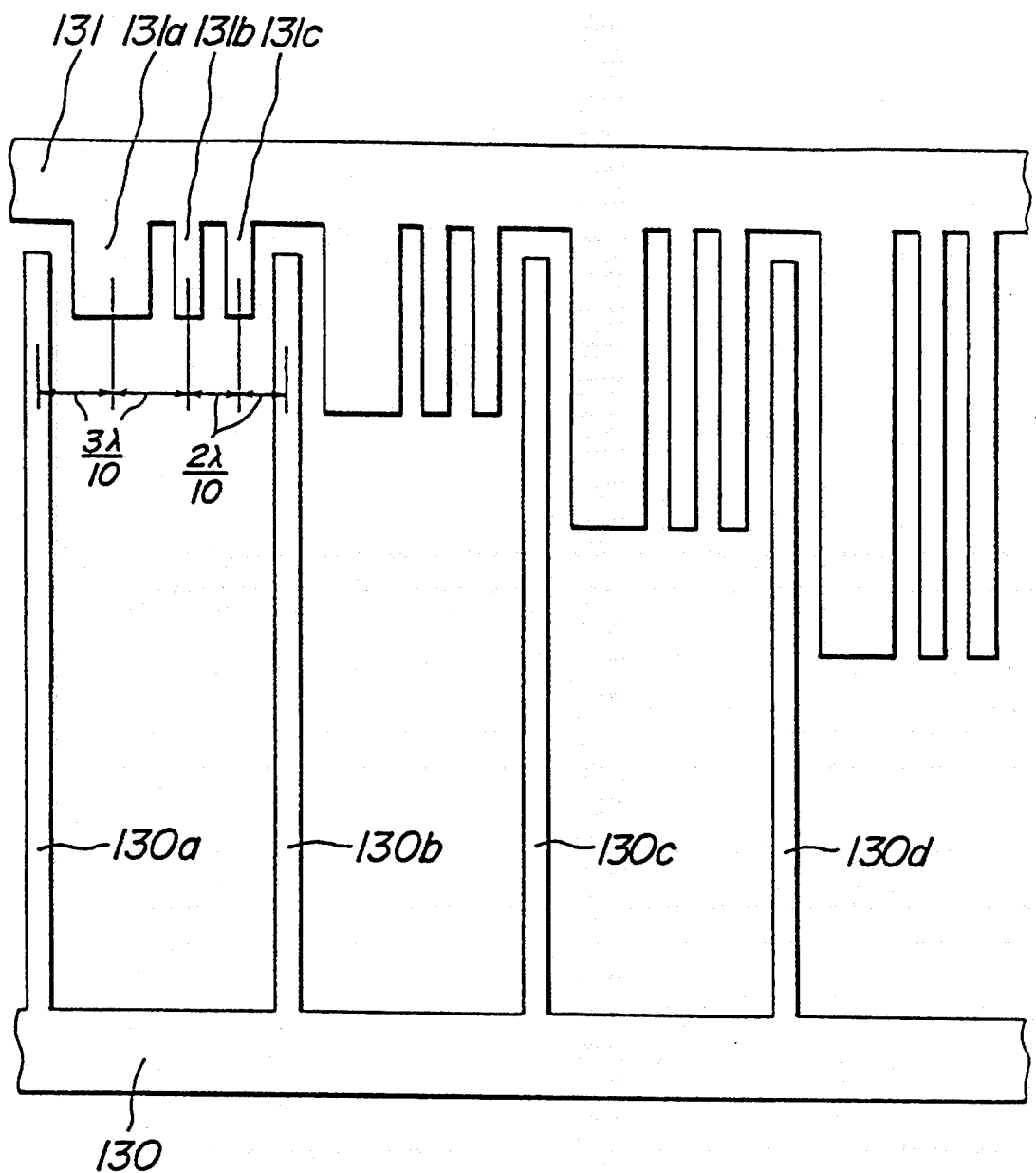

The transducer shown in FIG. 20 is also the one suitable for a quartz substrate with a small electromechanical coupling coefficient. The electrode fingers 130a to 130d of the positive electrode 130 with an electrode width of $\lambda/10$ are formed in serial order with a pitch which is same as the wavelength $\lambda$ of the fundamental wave. The negative electrode 131 has three kinds of electrode fingers 131a, 131b and 131c which are also set in serial order with a pitch $\lambda$. The width of the electrode finger 131a is $3\lambda/10$ and the widths of the electrode fingers 131b and 131c are to $\lambda/10$. The center distances between the electrode fingers, as shown in FIG. 20, are made as $3\lambda/10$, $3\lambda/10$, $2\lambda/10$ and $2\lambda/10$. The electrode finger 131b acts as a shunt-type floating electrode. Such an electrode structure can realize a second harmonic surface acoustic wave filter device which amplifies a second harmonic wave and having good characteristics.

Figure 21:
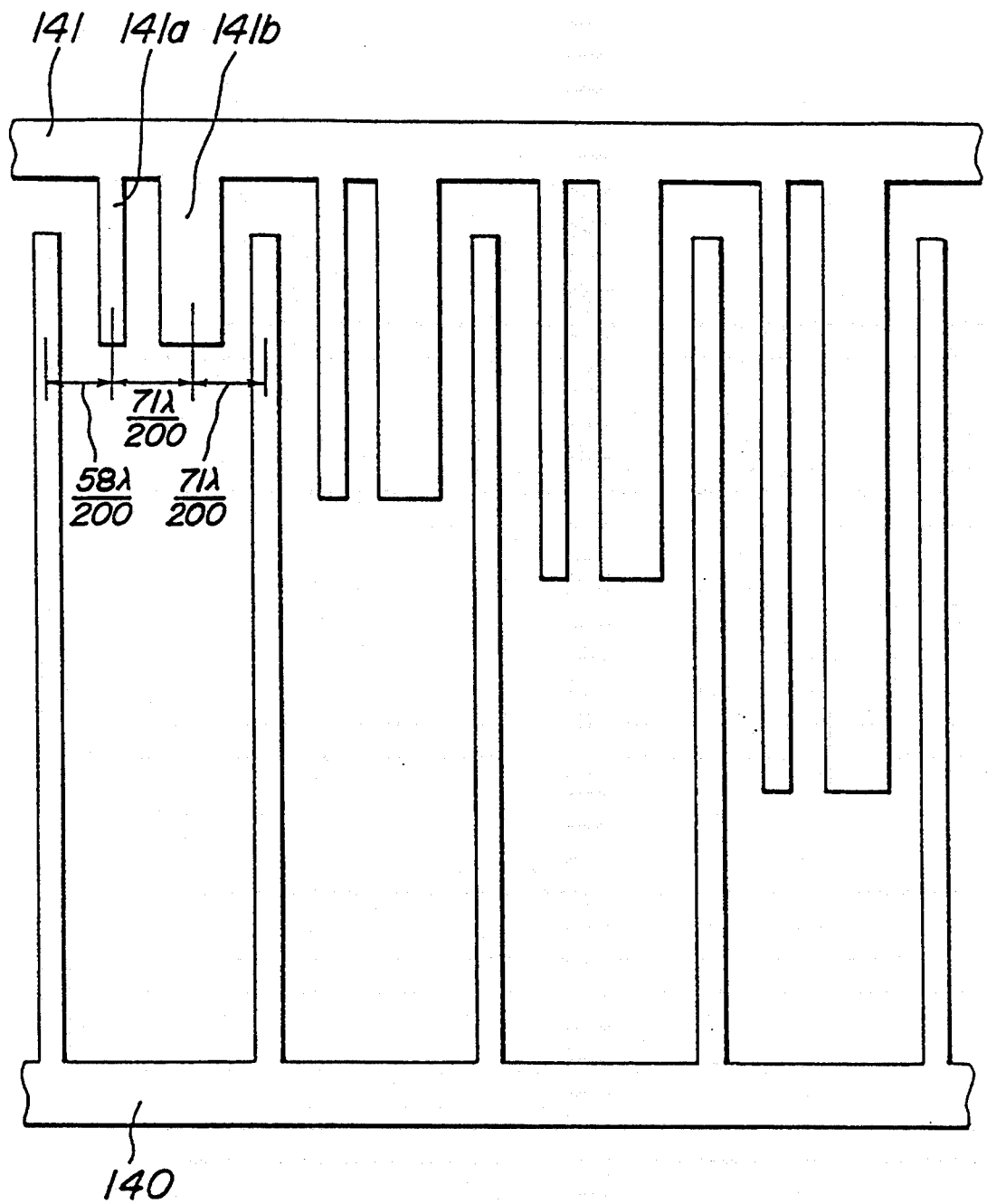

FIG. 21 also shows a second harmonic transducer suitable for the quartz substrate. The respective electrode fingers of the positive electrode 140 have their width set at $29\lambda/200$ and are formed in serial order with a pitch of $\lambda$. The negative electrode 141 has an electrode finger 141a with an electrode width of $29\lambda/200$ and an electrode finger 141b with the electrode width of $55\lambda/200$. These electrode fingers are also formed in serial order with the pitch of $\lambda$. The center distances between the respective electrode fingers are $58\lambda/200$, $71\lambda/200$ and $71\lambda/200$. In the present embodiment, the electrode finger 141b functions as a floating electrode because the end side confronting the electrode finger 141a does not perform the exciting function and has a strong mechanical reflection effect, and the end side confronting the positive electrode 140 achieves the exciting function and serves as an electrode finger for excitation.

Figure 22:
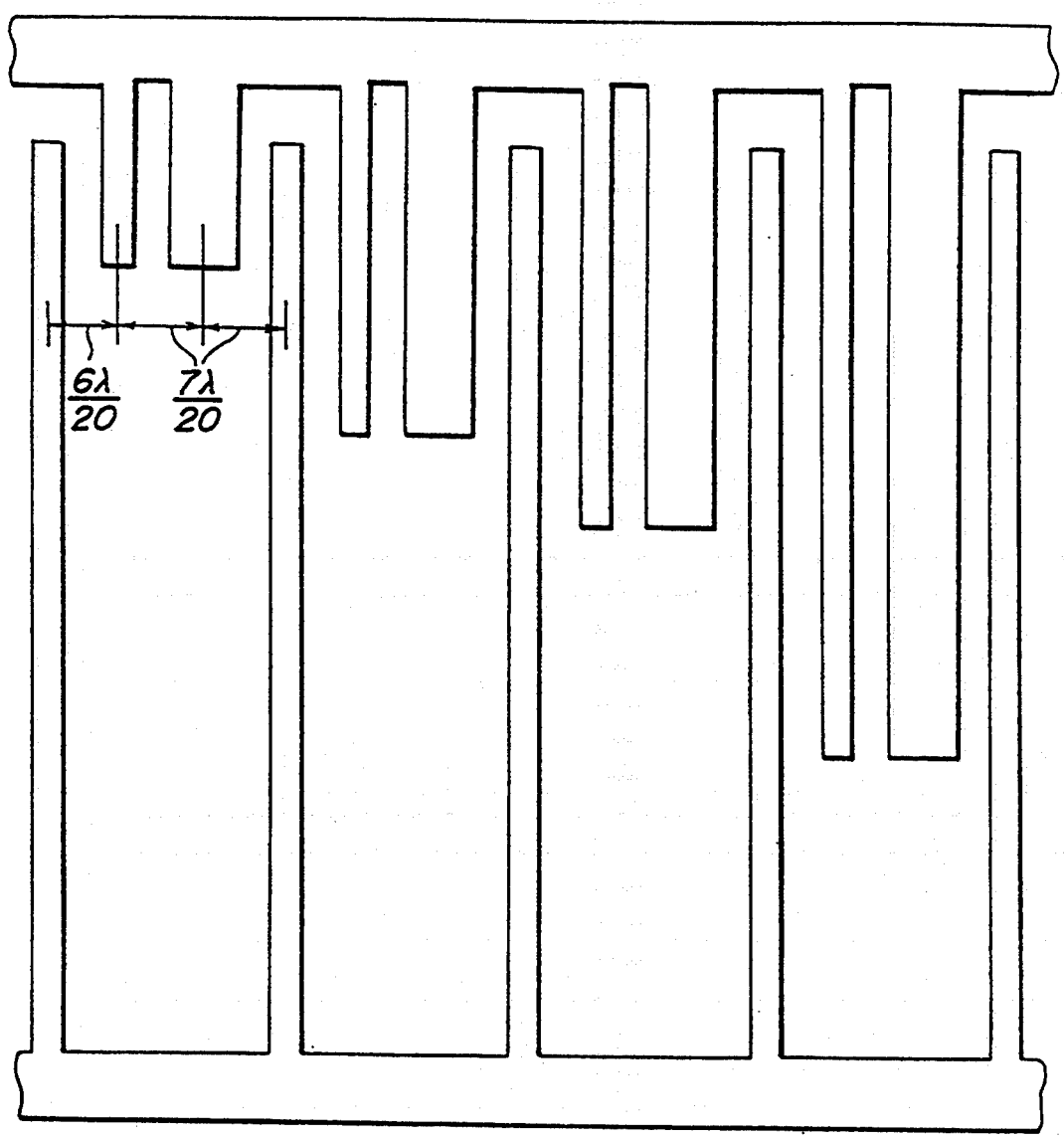

FIG. 22 shows a structure which is similar to the transducer of FIG. 21. There is only a difference in that the layout pitches of the respective electrode fingers are set to $6\lambda/20$, $7\lambda/20$ and $7\lambda/20$ in serial order along the propagation direction of the surface acoustic wave.

Figure 23:
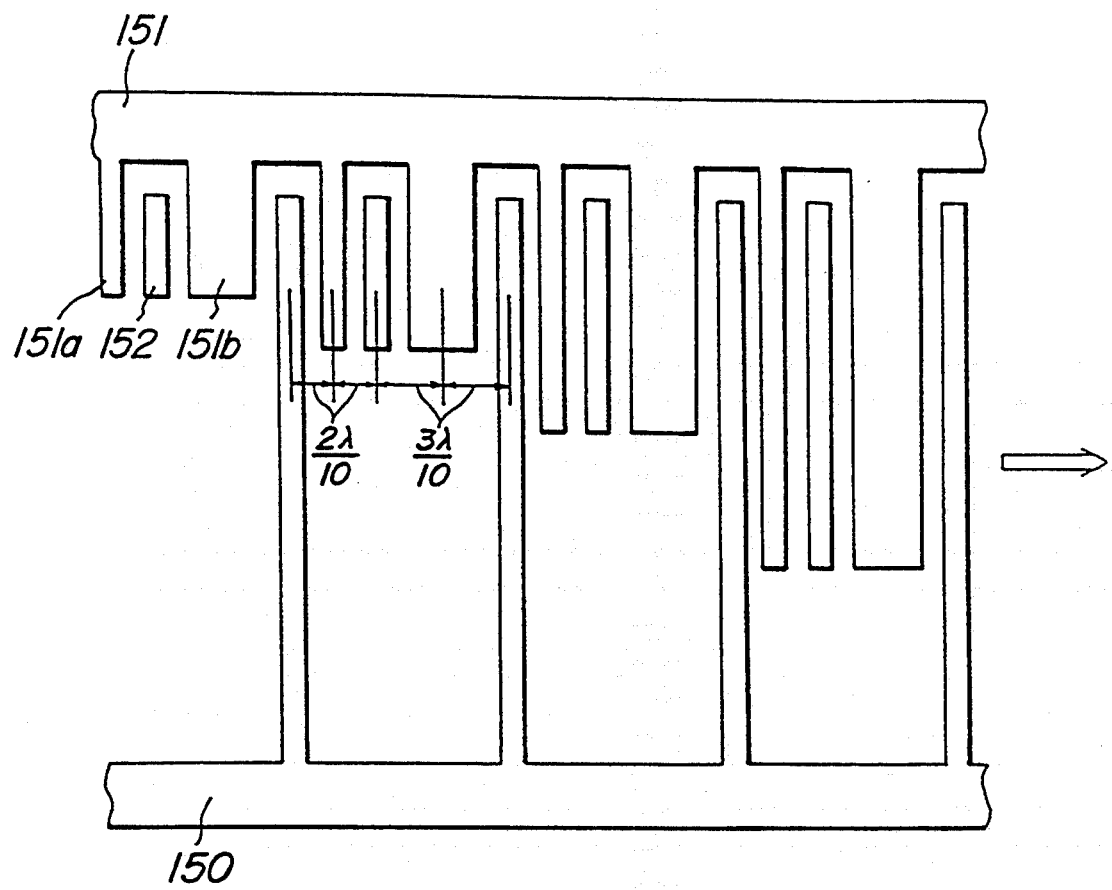

FIG. 23 shows a second harmonic transducer suitable for a LiNbO$_3$ substrate with a high electromechanical coupling coefficient. Respective electrode fingers of the positive electrode 150 has an electrode width of $\lambda/10$ and is arranged with a pitch $\lambda$. The negative electrode 151 has an electrode finger 151a with the electrode width $\lambda/10$, and an electrode finger 151b with the electrode width $3\lambda/10$. The open-type floating electrode 152 is arranged between the electrode fingers 151a and 151b of the negative electrode. Each center distance between the electrode fingers, as shown in FIG. 23, is set to $2\lambda/10$, $2\lambda/10$, $3\lambda/10$ and $3\lambda/10$.

FIG. 24 also shows the structure of a second harmonic transducer suitable for a LiNbO$_3$ substrate. Respective electrode fingers of the positive electrode 160 has the electrode width $\lambda/10$, and is formed in serial order with a pitch $\lambda$. The negative electrode 161 has three kinds of electrode fingers 161a, 161b and 161c and they are formed in serial order with a pitch $\lambda$, respectively. The electrode widths of the electrode fingers are $\lambda/10$, respectively. The center distances between the respective electrode fingers is set with equal internal of $2\lambda/10$. In this case, the electrode finger 161b of the negative electrode acts as a shunt-type floating electrode, so that it takes a form in which the open-type floating electrode 162 and the shunt-type floating electrode 161b are combined.

FIG. 25 shows the structure of transducer suitable for both of quartz substrate and LiNbO$_3$ substrate. The positive electrode 170 has an electrode width of $\lambda/8$ and is formed in serial order with a pitch $\lambda$. The negative electrode 171 has an electrode 171a of an electrode width $3\lambda/8$ and an electrode finger 171b of an electrode width of $\lambda/8$. The electrode fingers are formed in serial order with a pitch $\lambda$. The center distances between respective electrode fingers are $3\lambda/8$, $3\lambda/8$ and $2\lambda/8$.

The present invention is applicable for various modifications without being restricted only to the above mentioned embodiment. For example, a crystal is used as a material having a small electrical and mechanical coupling coefficient in the embodiment, however, another material such as Li$_2$B$_4$O$_7$ can be used.

The unidirectional acoustic surface-wave transducer according to the present invention is constructed as described above. Therefore, it can be generally manufactured at a low cost which is comparable with that of ordinary acoustic surface-wave device. This is because an electrode can be formed by a single cycle step including evaporation, exposure and etching, and it is unnecessary to provide a special phase shifter for obtaining the unidirectional transducer. In addition, when the transducer in accordance with the present invention is used as an input/output transducer, it is possible to minimize the ripple due to TTE (triple transit echo) which is inherent property of unidirectional transducers, because there are no factors which result in undesirable loss. Therefore, the present invention is particularly effective to realize a filter device with a small insertion loss, which can be manufactured at a low cost.

According to the embodiment of the present invention, in conjunction with amplification and conversion of a higher-order harmonic wave with respect to the fundamental surface acoustic wave defined by the pitch of electrode, the electrode structure is defined in accordance with a distance weighting method, it is possible to improve the side-lobe characteristic of the surface acoustic wave filter device for converting the higher-order harmonic wave. As the result, the manufacturing yield of the surface acoustic wave filter device is further improved. Furthermore, provision of the dummy electrodes makes it possible to avoid degradation of the frequency shift characteristics, and further improve the side-lobe characteristics in the higher frequency side with reference to the center frequency.

What is claimed is:

1. A surface acoustic wave filter device comprising:
   a substrate comprising a piezoelectric material and having a surface;
   an interdigital-type input side unidirectional transducer applied on said surface of said substrate and including an input side positive electrode having a plurality of electrode fingers, and an input side negative electrode having a plurality of electrode fingers each arranged between successive electrode fingers of said input side positive electrode; and
   an interdigital-type output side unidirectional transducer applied on said surface of said substrate and including an output side positive electrode having a plurality of electrode fingers, and an output side negative electrode having a plurality of electrode fingers each arranged between successive electrode fingers of said output side positive electrode, said output side transducer having a symmetrical electrode arrangement to said input side transducer;
   wherein each of said input side and output side transducers includes at least one group of electrode fingers which are successively arranged in a propagation direction of the surface acoustic wave, said group comprising first and second electrode fingers of the positive electrode and first, second and third electrode fingers of the negative electrode, said first, second and third electrode fingers of the negative electrode being arranged between said first and second electrode fingers of the positive electrode, said electrode fingers of said positive and negative electrodes of each of said input side and output side transducers being arranged so as to transduce a harmonic wave of a selected order which is higher relative to a fundamental surface acoustic wave.

2. The surface acoustic wave filter device of claim 1, wherein said harmonic wave is a second order harmonic wave having an operation frequency which is two times a fundamental operation frequency of the fundamental surface acoustic wave.

3. The surface acoustic wave filter device of claim 1, wherein each of said input side and output side transducers further comprises a floating electrode having at least one electrode finger which is arranged between adjacent electrode fingers of said positive and negative electrodes of the relevant transducer.

4. The surface acoustic wave filter device of claim 1, wherein said electrode fingers define a plurality of tracks which extend in parallel with each other in said propagation direction of the acoustic surface wave, said tracks having respectively predetermined track lengths as measured in said propagation direction, said predetermined track lengths varying in a transverse direction at right angles to said propagation direction, said tracks having respectively predetermined track widths as measured in said transverse direction, said predetermined track widths varying in said transverse direction.

5. The surface acoustic wave filter device of claim 4, wherein said electrode fingers are associated with dummy electrodes which are arranged in line with and opposed to respective electrode fingers, said dummy electrodes having respectively predetermined lengths as measured in said transverse direction, said predetermined lengths of the dummy electrodes being determined in accordance with the lengths of the relevant electrode fingers.

6. The surface acoustic wave filter device of claim 1, wherein said fundamental surface acoustic wave has a wavelength $\lambda$, said first and second electrode fingers of the positive electrode and said first, second and third electrode fingers of the negative electrode each having a width $\lambda/10$, said first electrode finger of the positive electrode being spaced from said first electrode finger of the negative electrode by a center distance $\lambda/5$, said first and second electrode fingers of the negative electrode being spaced from each other by a center distance $\lambda/5$, said second and third electrode fingers of the negative electrode being spaced from each other by a center distance $2\lambda/5$, and said third electrode finger of the negative electrode being spaced from said second electrode finger of the positive electrode by a center distance $\lambda/5$.

7. The surface acoustic wave filter device of claim 1, wherein said fundamental surface acoustic wave has a wavelength $\lambda$, said first and second electrode fingers or the positive electrode and said first, second and third electrode fingers of the negative electrode each having a width $\lambda/10$, said first electrode finger of the positive electrode being spaced from said first electrode finger of the negative electrode by a center distance $7\lambda/40$, said first and second electrode fingers of the negative electrode being spaced from each other by a center distance $7\lambda/40$, said second and third electrode fingers of the negative electrode being spaced from each other by a center distance $18\lambda/40$, and said third electrode finger of the negative electrode being spaced from said second electrode finger of the positive electrode by a center distance $\lambda/5$.

8. The surface acoustic wave filter device of claim 1, wherein said fundamental surface acoustic wave has a wavelength $\lambda$, said first and second electrode fingers of the positive electrode and said second and third electrode fingers of the negative electrode each having a width $\lambda/10$, said first electrode finger of the negative electrode having a width $3\lambda/10$, said first electrode finger of the positive electrode being spaced from said first electrode finger of the negative electrode by a center distance $3\lambda/10$, said first and second electrode fingers of the negative electrode being spaced from each other by a center distance $3\lambda/10$, said second and third electrode fingers of the negative electrode being spaced from each other by a center distance $\lambda/5$, and said third electrode finger of the negative electrode being spaced from said second electrode finger of the positive electrode by a center distance $\lambda/5$.

9. A surface acoustic wave filter device comprising:

a substrate comprising a piezolectric material and having a surface;

an interdigital-type input side unidirectional transducer applied on said surface of said substrate and including an input side positive electrode having a plurality of electrode fingers, and an input side negative electrode having a plurality of electrode fingers each arranged between successive electrode fingers of said input side positive electrode; and an interdigital-type output side unidirectional transducer applied on said surface of substrate and including an output side positive electrode having a plurality of electrode fingers, and an output side negative electrode having a plurality of electrode fingers each arranged between successive electrode fingers of said output side positive electrode, said output side transducer having a symmetrical electrode arrangement to said input side transducer;

wherein each of said input side and output side transducers includes at least one group of electrode fingers which are successively arranged in a propagation direction of the surface acoustic wave, said group comprising first and second electrode fingers of the positive electrode and first and second electrode fingers of the negative electrode, said first and second electrode fingers of the negative electrode being arranged between said first and second electrode fingers of the positive electrode, said electrode fingers of said positive and negative electrodes of each of said input side and output side transducers being arranged so as to transduce a harmonic wave of a selected order which is higher relative to a fundamental surface acoustic wave; and wherein said fundamental surface acoustic wave has a wavelength $\lambda$, said first and second electrode fingers of the positive electrode and said first electrode finger of the negative electrode each having a width $3\lambda/20$, said second electrode finger of the negative electrode having a width $5\lambda/20$, said first electrode finger of the positive electrode being spaced from said first electrode finger of the negative electrode by a center distance $6\lambda/20$, said first and second electrode fingers of the negative electrode being spaced from each other by a center distance $7\lambda/20$, said second electrode finger of the negative electrode being spaced from said second electrode finger of the positive electrode by a center distance $7\lambda/20$.

10. A surface acoustic wave filter device comprising:

a substrate comprising a piezoelectric material and having a surface;

an interdigital-type input side unidirectional transducer applied on said surface of said substrate and including an input side positive electrode having a plurality of electrode fingers, and an input side negative electrode having a plurality of electrode fingers each arranged between successive electrode fingers of said input side positive electrode; and an interdigital-type output side unidirectional transducer applied on said surface of substrate and including an output side positive electrode having a plurality of electrode fingers, and an output side negative electrode having a plurality of electrode fingers each arranged between successive electrode fingers of said output side positive electrode, said output side transducer having a symmetrical electrode arrangement to said input side transducer;

wherein each of said input side and output side transducers includes at least one group of electrode fingers which are successively arranged in a propagation direction of the surface acoustic wave, said group comprising first and second electrode fingers of the positive electrode and first and second electrode fingers of the negative electrode, said first and second electrode fingers of the negative electrode being arranged between said first and second electrode fingers of the positive electrode, said electrode fingers of said positive and negative electrodes of each of said input side and output side transducers being arranged so as to transduce a harmonic wave of a selected order which is higher relative to a fundamental surface acoustic wave; and wherein said fundamental surface acoustic wave has a wavelength $\lambda$, said first and second electrode fingers of the positive electrode and said first electrode finger of the negative electrode each having a width $29\lambda/200$, said second electrode finger of the negative electrode having a width $55\lambda/200$, said first electrode finger of the positive electrode being spaced from said first electrode finger of the negative electrode by a center distance $58\lambda/200$, said first and second electrode fingers of the negative electrode being spaced from each other by a center distance $71\lambda/200$, said second electrode finger of the negative electrode being spaced from said second electrode finger of the positive electrode by a center distance $71\lambda/200$.

* * * * *